(12) United States Patent
Hazama et al.

(10) Patent No.: US 6,583,854 B1
(45) Date of Patent: Jun. 24, 2003

(54) METHOD AND APPARATUS FOR THE MANUFACTURE OF CIRCUITS FOR A LARGE DISPLAY DEVICE USING STITCH EXPOSURE

(75) Inventors: Junji Hazama, Yokohama (JP); Tohru Kiuchi, Higashikurume (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 09/722,608

(22) Filed: Nov. 28, 2000

(30) Foreign Application Priority Data

Nov. 30, 1999 (JP) .............................. 11-339358

(51) Int. Cl.[7] .............................................. G03B 27/42
(52) U.S. Cl. ....................................................... 355/53
(58) Field of Search ................................ 355/53, 46, 77

(56) References Cited

U.S. PATENT DOCUMENTS

| | | | |
|---|---|---|---|
| 4,748,478 A | 5/1988 | Suwa et al. | |
| 4,769,680 A | 9/1988 | Resor, III et al. | |
| 4,924,257 A | 5/1990 | Jain | |
| 4,982,227 A | 1/1991 | Suzuki | |
| 5,437,946 A | * 8/1995 | McCoy | ................ 355/53 |
| 5,530,516 A | 6/1996 | Sheets | |
| 5,602,620 A | 2/1997 | Miyazaki et al. | |
| 5,623,853 A | 4/1997 | Novak et al. | |
| 5,625,436 A | 4/1997 | Yanagihara et al. | |
| 5,656,526 A | 8/1997 | Inada et al. | |
| 5,729,331 A | 3/1998 | Tanaka et al. | |
| 5,795,686 A | * 8/1998 | Takizawa et al. | ............ 355/77 |
| 5,888,676 A | 3/1999 | Saitoh | |
| 6,204,912 B1 | * 3/2001 | Tsuchiya et al. | ............ 355/53 |
| 6,295,119 B1 | * 9/2001 | Suzuki | ................... 355/53 |

FOREIGN PATENT DOCUMENTS

| | | |
|---|---|---|
| JP | 61209831 | 9/1986 |
| JP | 63211623 | 9/1988 |
| JP | 63312636 | 12/1988 |
| JP | 1227432 | 9/1989 |
| JP | 6324474 | 11/1994 |
| JP | 8233964 | 9/1996 |

* cited by examiner

Primary Examiner—Russell Adams
Assistant Examiner—D. Ben Esplin

(57) ABSTRACT

A method and apparatus for the manufacture of circuits for a large display device using stitch exposure. In the peripheral region of a circuit pattern on a mask, the method of stitch exposing provides for a joining of pairs of stitch regions in order to join in an interfitting state such that a smaller mask can be combined to form a larger display device. By causing the corresponding positional relationship of mask and plate to change in a direction in which a pair of stitch regions face each other, the arrangement of respectively formed pattern counterparts, after being placed in a mutually complementary interfitting relationship, are transferred so as to be joined to the respective stitch region of a circuit pattern region periphery already transferred onto the plate.

19 Claims, 26 Drawing Sheets

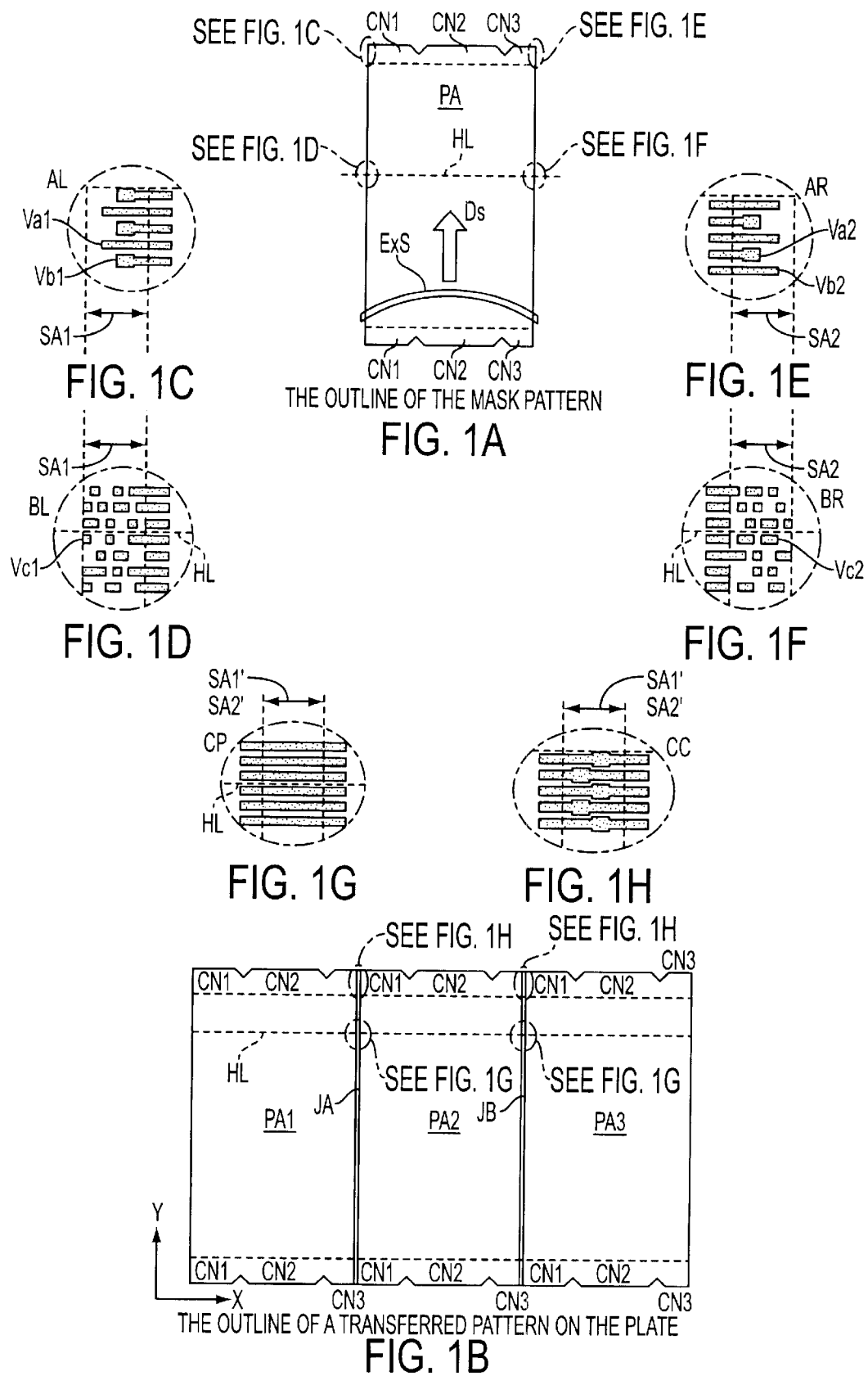

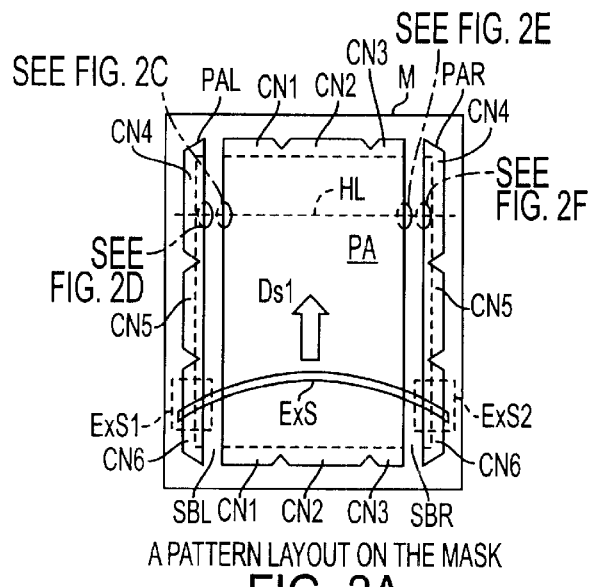
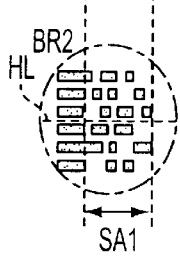
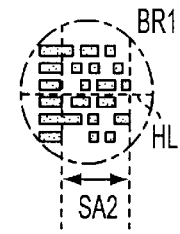
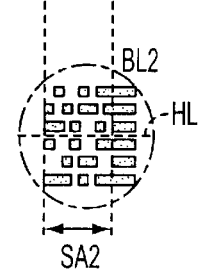
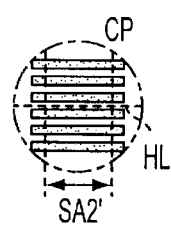
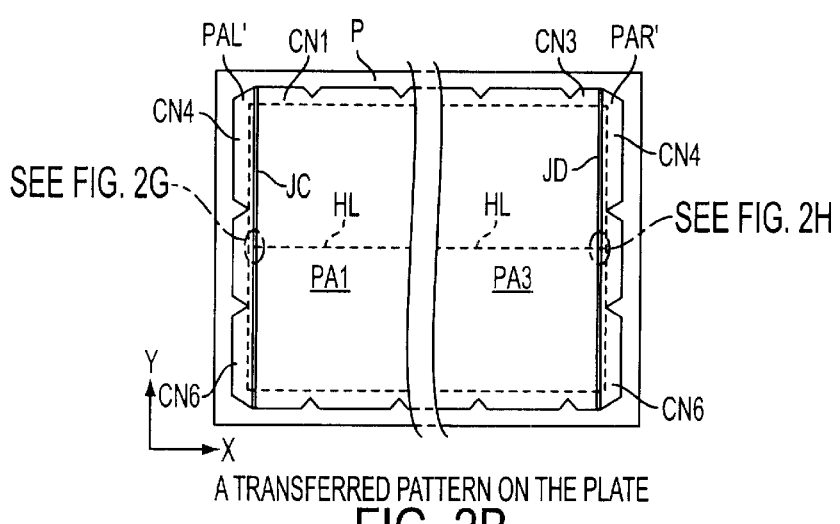

THE GATE LINE PATTERN IN THE STITCHING REGION (SA1,SA2)
OF THE LEFT-HAND PATTERN REGION

THE GATE LINE PATTERN IN THE STITCHING REGION (SA1,SA2)
OF THE RIGHT-HAND PATTERN REGION

THE a-Si LAYER PATTERN IN THE STITCHING REGION (SA1, SA2)
OF THE LEFT-HAND PATTERN REGION

THE a-Si LAYER PATTERN IN THE STITCHING REGION (SA1, SA2)
OF THE RIGHT-HAND PATTERN REGION

THE SOURCE/DRAIN PATTERN IN THE STITCHING REGION (SA1,SA2)
OF THE LEFT-HAND PATTERN REGION

THE SOURCE/DRAIN PATTERN IN THE STITCHING REGION (SA1,SA2)
OF THE RIGHT-HAND PATTERN REGION

THE CELL (ITO) PATTERN IN THE STITCHING REGION (SA1,SA2)
OF THE LEFT-HAND PATTERN REGION

THE CELL (ITO) PATTERN IN THE STITCHING REGION (SA1,SA2)
OF THE RIGHT-HAND PATTERN REGION

METHOD AND APPARATUS FOR THE MANUFACTURE OF CIRCUITS FOR A LARGE DISPLAY DEVICE USING STITCH EXPOSURE

CROSS-REFERENCE TO RELATED APPLICATIONS

This application claims the benefit of Japanese Application No. 11-339358, filed Nov. 30, 1999, in the Japanese Patent Office, the disclosure of which is incorporated herein by reference.

BACKGROUND OF THE INVENTION

1. Field of the Invention

This invention relates to the manufacture of large scale display devices, and more particularly, the manufacture of large scale display devices by the stepping and scanning projection of images from a mask onto a plate.

2. Description of the Related Art

In recent years, there have been advances in the enlargement of the picture surface of display devices (made with glass plates) with a built-in liquid crystal display device or plasma display device. Mass produced articles having a display region of about 30–40 inches are being produced, with a future prospect of 60-inch wall mount type display devices having a width to height (aspect) ratios of 16:9. Further, for the production of printed circuit boards (ceramic plate, epoxy plate, high-molecular film sheet, and the like) of mother boards or CPU sub-boards used in electrical products to mount larger electronic devices, there is a need to both make the line width of the wiring patterns finer in order to increase the mounting density, and enlarge the boards.

Generally, photolithography is used to manufacture the fine circuit patterns for the display cells or wiring used for display panels, and is also used to manufacture the printed circuit boards used for electrical devices. The central role in the photolithography process is the need for an accurate exposure device to transfer an image of the circuit pattern on a mask to a resist (i.e., a plate coated with a substrate of uniform thickness on a glass plate or printed circuit board).

Conventional solutions using various exposure devices and exposure procedures have developed to transfer large circuit pattern structures onto glass plates or printed circuit boards. Among these solutions, picture surface stitch exposure methods have attracted attention. For these methods, the circuit patterns from the mask are joined on the substrate.

One such picture surface stitch exposure method is described in Japanese Unexamined Patent Publication JP-A-S62-145730 (U.S. Pat. No. 4,748,478). According to this method, a projection exposure device (stepper) is equipped with a high resolution projection lens, a mask (reticle) is divided into multiple circuit pattern regions, and a plate (substrate) to be exposed is on a stage. The projection exposure device moves/steps the stage to join the projected circuit pattern images on the substrate.

A similar known stepper type of exposure method is disclosed in JP-A-H1-161243 (U.S. Pat. No. 4,769,680). This method uses two high resolution projection lenses at fixed intervals. These lenses simultaneously expose the circuit pattern of masks installed in the respective projection lenses onto the plate, and join each respective projected image to the two circuit patterns on the preceding exposed substrate.

However, when forming large circuit pattern regions, such as those used for a display device, it is necessary to join images of multiple circuit patterns on a substrate. To accomplish this, methods, such as that disclosed in WO 95/16276, JP-A-H9-1909624 (U.S. Pat. No. 5,888,676), use stitch portions of respective circuit pattern images to make continuous boundaries (straight lines, polygonal lines, wavy lines, rectangles and the like). However, when there is a large difference in contrast of the stitch portions, this results in this boundary being visually observed, which is a disadvantage of this method.

For example, when exposing two respective circuit pattern images to be adjacently stitched onto a substrate using conventional methods, the gate width and the like of transistors used for driving color elements formed in the circuit pattern regions (display regions) differ minutely in the circuit patterns. This difference is due to residual alignment errors, residual focus errors, exposure amount control accuracy, and even differences in the drive voltage. This difference causes the transparency of the liquid crystal pixels to differ slightly in the resulting display regions.

To solve this problem, a method of gradation of the boundary line of the stitch portion has been developed as disclosed in JP-A-H6-324474. According to this method, a predetermined width in the stitch portion of the display portion is set within the circuit pattern, and the width is divided in a random stepping-stone form of interfitting relationship. By this method, without making a clear boundary line in the stitch portion, the combination of the fine pattern having a predetermined width and granularized as a whole is joined in an interfitting state.

The manufacture of circuit devices and display devices having display regions is possible by the various stitch exposure methods of the prior art. However, when taking the cycle time into account, they are not practical stitch exposure methods. For a liquid crystal device, because repeated stitch exposure of the mask pattern is possible in order to expose a display device, it is not necessary to change the mask frequently. However, when exposing the peripheral circuit portions of the display region (end portion pattern), the mask pattern must be frequently changed, and this changeover time increases the overall manufacturing time.

Of course, if the whole of the display region and the peripheral circuit portions are placed, unaltered, on one large mask that is larger than the external dimensions of the display device, it is possible to form the whole circuit pattern for the display device on the substrate without either exchanging the mask and stitch exposure. Nevertheless, in order to manufacture a device that has a size of 30–60 inches, a mask of the same size is necessary, and this makes the production of the mask difficult. In addition, as the size of the exposure device increases, the production of the mask becomes worse, particularly the mask stage unit.

SUMMARY OF THE INVENTION

Consequently, the present invention has as its object to provide a method of manufacturing a large circuit device or display device without a pronounced stitch mark by processing the arrangement or configuration of circuit patterns formed in a mask.

Another object of the present invention is to provide a method of manufacturing a large size circuit device or display device, while reducing the number of masks which are necessary during mask exposure.

Yet another object of the invention is to obtain a large size display device based on performing a smaller number of scans using a scanning exposure device.

Additional objects and advantages of the invention will be set forth in part in the description which follows and, in part, will be obvious from the description, or may be learned by practice of the invention.

In an embodiment of the present invention, a method of manufacture of a circuit device comprises exposing the substrate while causing the relative positional relationship of the mask and plate to change so that circuit pattern regions on the mask are transferred with mutual stitching onto the plate for use in circuit device formation, and within the peripheral region of the circuit pattern region of the mask, respectively formed pattern counterparts of a pair of stitch regions (SA1, SSA2) are facing each other in the direction in which the relative positional arrangement is changed so as to form a mutually complementary interfitting relationship after exposure, and exposing the substrate while the relative changing positional arrangement to transfer both sides or one side of the pair of stitch regions on the mask and causing them to join in an interfitting state with the similar stitch region of the circuit pattern region periphery already transferred onto the plate.

In another embodiment of the present invention, within the pair of stitch regions the stitch regions comprise a repetitively formed fine pattern structure at predetermined intervals with respect to the direction in which the relative positional relationship is caused to change.

In another embodiment of the present invention, the configuration or arrangement of respectively formed pattern counterparts of the pair of stitch regions are made in a mutually complementary random interfitting relationship.

In another embodiment of the present invention, a minimum unit making the mutually complementary random interfitting relationship is determined to make a repetitively formed fine pattern structure at predetermined intervals.

In another embodiment of the present invention, a circuit device is a display portion of the display device with the minimum unit is a pixel.

In another embodiment of the present invention, each pixel has three pixel cell units corresponding to the three colors used in color display and, the fine pattern structure of the minimum unit comprising the mutually complementary random intermitting relationship was set in the pixel cell units.

In another embodiment of the present invention, each pixel of the display portion has three pixel cell units corresponding to the three colors, red, green and blue, for color display use, the complementary interfitting arrangement between pairs of stitch regions was made with the minimum unit being the division pattern elements divided by the number of pixel cell units, and arraying the division pattern elements in random stepping-stone form with respect to the direction in which the relative positional arrangement is caused to change.

In another embodiment of the present invention, the width in the direction in which the respective relative positional relationship of the pair of stitch regions is caused to change is determined according to a contrast difference (gradation difference) between two adjoining display regions formed by stitch exposure onto the plate.

In another embodiment of the present invention, a method of forming a large two-dimensional display device on a plate comprises stitch exposing circuit patterns formed on a mask onto a plate, where the circuit pattern formed on the plate is a laminated structure with mutually positionally united plural layers, and where the form of a first joint arising during stitch exposing the circuit pattern on the first N-th layer mask onto the plate or the configuration state of the circuit pattern on the first mask exposed within stitch regions differs from that of the second joint stitch exposed from the circuit pattern on the adjacent layer mask for the adjacent layers on the plate.

In a further embodiment of the present invention, the stitch regions are the multiples of the same circuit counterpart formed on the mask, or, when stitch exposing different circuit pattern counterparts onto the plate, are the overlapping portions of the stitch portions have a predetermined width, where the envelope curve joining the outer edges of the circuit patterns exposed within the stitch regions on the mask are a periodic waveform (i.e., an undulating line, triangular wave, rectangular wave) on the mask for use in forming the one layer, and making the waveforms a random polygonal line on adjacent layer masks, causing the configuration of the joint to differ between layers.

In another embodiment of the present invention, the amplitude of the envelope curve of the circuit pattern outer edge formed as a continuous periodic waveform or random polygonal line is the same as the width of the overlap of the stitch regions.

In another embodiment of the present invention, by stitch exposing circuit pattern counterparts formed on single or plural masks within the stitch regions onto the plate, where the peripheral region counterparts of circuit patterns to be stitched overlap by a predetermined width, the circuit patterns within these stitch regions are divided into pattern elements by randomly distributing, forming, and placing the divided pattern elements in respective peripheral regions of the circuit patterns on the masks to be stitch exposed, the configuration circuit patterns on the masks exposed within stitch regions on the plate differs between layers.

In another embodiment of the present invention, a method comprising sequentially projecting exposures where regions on the plate formed from a rectangular pattern region on the mask are mutually connected, and forming a large two-dimensional display device on the plate by moving the mask and the plate with respect to a projection system relative to a long side direction of the rectangular pattern region on the mask, stitch exposing a first image of the rectangular pattern region onto the plate, changing the relative position of the mask and plate relative to a short side direction of the rectangular pattern region on the mask positioning the mask and plate such that a second image of the rectangular pattern region is joined to the first image by stitch exposure, and the display region formed on the plate is formed in the rectangular pattern using a horizontal scan line in the direction at perpendicular to the direction of the scanning movement.

In another embodiment of the present invention, the two-dimensional display device has drive signal lines providing individual drive signals of each display pixel, and the rectangular pattern region formed on the mask includes terminal regions in at least one external portion of its long side direction in order to respectively arrange the drive signal lines in least one of its terminal regions dividing the terminal regions into respective rectangular pattern regions corresponding to the projected first image and second image stitch exposed together.

In another embodiment of the present invention, the dimension in the short side direction of the rectangular pattern region is made of a single integral part of the width of the terminal region.

In another embodiment of the present invention, the whole exposure range of the non-scanning direction is perpendicular to the direction of scanning exposure so as to include the dimension of the short side direction of the rectangular pattern region, and multiple projection optical systems are adjacently positioned along the non-scanning direction to scan expose within the respective visual fields of these plural projection optical systems and limiting the specific visual fields according to the dimension of the short side direction of the rectangular pattern region.

In another embodiment of the present invention, the whole exposure range in the non-scanning direction has an arcuate slit shaped visual field that includes the dimension in the short side direction of the rectangular pattern region, wherein the arcuate slit-shaped visual field restricts the scanning exposure according to the dimension in the short side direction of the rectangular pattern region.

In another embodiment of the present invention, a circuit pattern for a display device is formed on the mask and is applied to manufacture a large size display device by stitch exposure on a plate, where the size of the display picture surface is 30 inches or more in the horizontal direction, and is divided in the horizontal direction into regions with each region formed by stitch exposing a circuit pattern on the plate by a scanning exposure device, where the long side direction of the respective divided regions is the direction of scanning movement of the plate by the scanning exposure device, and the short side direction of the respective divided regions is the direction of a horizontal scan line (HL) of the display picture surface and is set smaller than the maximum range of the projection visual field with respect to the non-scanning direction of the scanning exposure device.

In another embodiment of the present invention, the scanning exposure device is equipped with a mask stage that moves the mask at a roughly uniform speed during scanning exposure, reduces the dimension in the long side direction of the respective divided region, and is capable of fine movement in the non-scanning direction and fine rotation around an axis perpendicular to the surface of the mask, and a plate stage that supports the plate and moves at a uniform speed in the direction corresponding to the horizontal line (HL) of the display picture surface, and steps/moves in a direction corresponding to the horizontal line (HL) of the display picture surface.

BRIEF DESCRIPTION OF THE DRAWINGS

These and other objects and advantages of the invention will become apparent and more readily appreciated from the following description of the preferred embodiments, taken in conjunction with the accompanying drawings of which:

FIGS. 1A–H illustrate the shape and arrangement of images on a mask pattern and a plate to which it is transferred according to an embodiment of the present invention.

FIGS. 2A–H illustrate a relationship of the pattern arrangement on the mask plate and a plate to which it is transferred according to another embodiment of the present invention.

DESCRIPTION OF THE PREFERRED EMBODIMENTS

Figure 3:
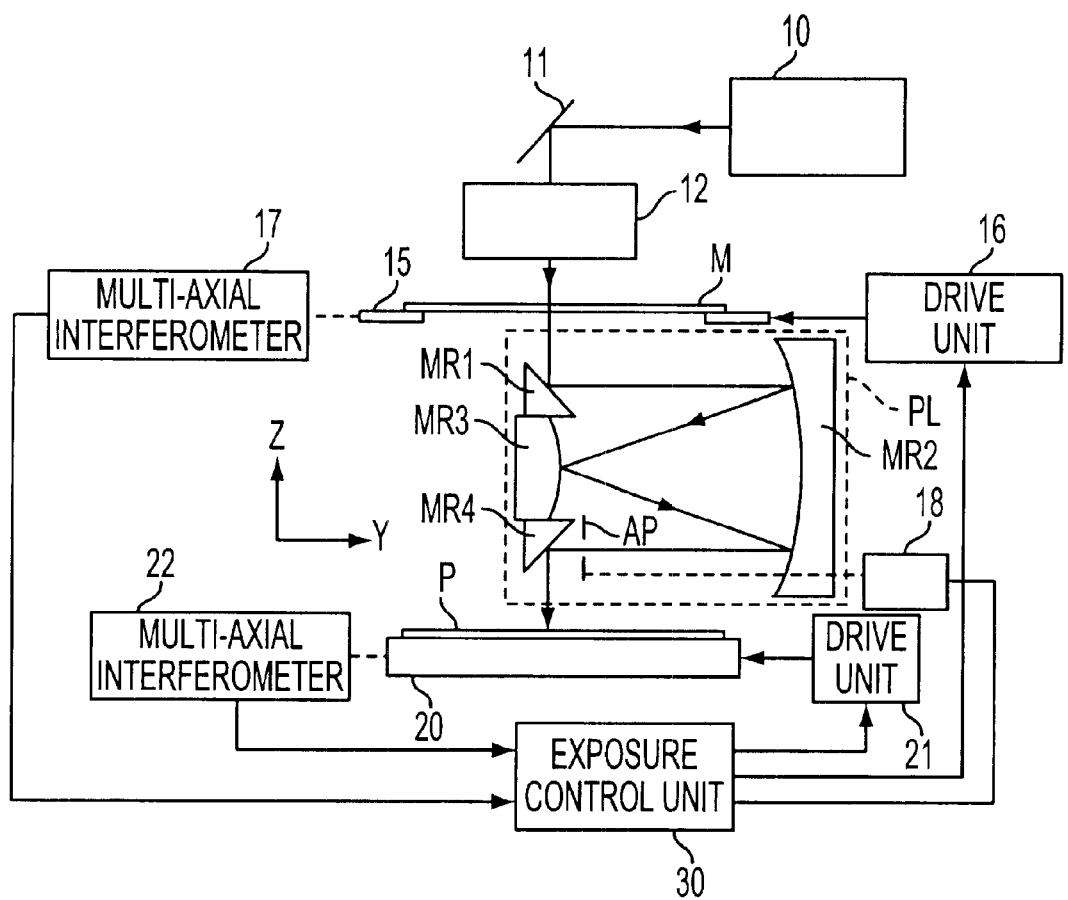
FIG. 3 schematically illustrates a scanning type projection exposure device according to the present invention.

Reference will now made in detail to the present preferred embodiments of the present invention, examples of which are illustrated in the accompanying drawings, wherein like reference numerals refer to the like elements throughout. The embodiments are described below in order to explain the present invention by referring to the figures.

FIGS. 1–2 are diagrams showing the mask pattern division method and the stitch (splice) exposure method on the plate according to an embodiment of the present invention as applied to the manufacture of a TFT type, large size liquid crystal display device. FIG. 3 schematically shows a mirror projection type exposure device that exposes the mask pattern of FIGS. 1 and 2 onto a plate (P).

FIG. 1 shows a collective pattern region PA formed on the mask M. Pattern region PA has a repeating (collective) pattern portion between a peripheral end pattern portions CN1, CN2, CN3. The overall form of pattern region PA is a rectangle with the long side in the Y direction, and a short side in the direction X. The short side X dimension is within the range of the non-scanning (X) direction of the circular arcuate slit form exposure visual field ExS of the mirror projection type exposure device shown in FIG. 3.

As shown in FIG. 1B, a large display device is formed by repeated exposure to transfer and join pattern PA of FIG. 1A in the X-direction on a plate, with the direction of the horizontal scan line HL being the X direction. Thus, when scan exposing a plate using a mirror projection type exposure device, the scanning direction (the Y direction shown by the arrow Ds) is perpendicular to the direction of movement (X).

In addition, the collective pattern region PA has a dimension in the perpendicular scan line (HL) direction in the display region of the display device after completion. As shown in FIG. 1B, the respective pattern regions PA is joined to be oriented in the vertical direction (Y direction), with the pattern regions PA1, PA2 and PA3 being stitch (splice) exposed in the direction (X direction) using the thin horizontal scan lines HL. Because of this, the peripheral end pattern portions CN1, CN2, CN3, arranged in the upper end side or lower end of the display region, are transferred in one scan exposure together with the pattern portion PA of the display region.

According to an embodiment of the present invention, in order to hide the joint portions (stitch portions) so they cannot be visually recognized on the display pattern elements after completion, the width of the horizontal scan lines HL of the stitch portions JA, JB shown in FIGS. 1G and H between pattern regions PA1, PA2 and PA3 on the plate is set to be roughly 5–50 mm. This range is chosen so that the left and right adjacent peripheral regions of PA1 and PA3 overlap (X direction width 5–50 mm). It is understood that this numerical value range is an example of a stitch width disclosed, and that other stitch widths are appropriate for other applications.

This overlap allows the left and right peripheral regions PA1 and PA3 to completely overlap the peripheral regions of PA2. In order for the individual configuration or arrangement formed within this left side peripheral region PA1 and PA2 and the individual configuration or arrangement formed within the right side peripheral region PA3 and PA2 to be in complementary interfitting relationship, the pattern shape counterparts, while differing upon closer examination, are stitch exposed and aligned accurately in the X&Y directions.

As shown in FIGS. 1C and D, the peripheral stitch region SA1 has a width (for example, 10 mm) along the left peripheral end of the collective pattern region PA. As shown in FIGS. 1E and F, the peripheral stitch region SA2 has a width (similarly, 10 mm) along the right peripheral end of the collective pattern region PA. The end portion configuration of CN1 within the stitch region SA1, shown in FIG. 1C, has plural wiring patterns extending in the X direction that are repetitively formed in the Y direction. Thus, wiring pattern Va1 has a straight end portion and a wiring pattern Vb1 has a slightly thickened end portion, wiring patterns Va1 and Vb1 are alternately formed in the Y direction, each slightly displaced in the Y direction.

The wiring pattern group of the terminal portion CN3 within the stitch region SA2, shown in FIG. 1E, also has wiring patterns extending in the X direction and are repetitively formed in the Y direction. Wiring pattern Va2 has a slightly thickened end portion, and wiring pattern Vb2 having a straight end portion are alternately formed, slightly displaced in the Y direction.

Furthermore, for a conventional liquid crystal device, in the end pattern portion CN1, there is no wiring pattern extending in the horizontal direction (X direction). However, if driver IC circuits are used to drive the pixel (picture element) transistors in the terminal portions CN1, CN2 and CN3, this kind of wiring pattern extending in the horizontal direction is then used.

In this manner, each wiring pattern group counterpart belonging to the end portions CN1, CN3 have complementary shapes with respect to the X direction when the stitch regions SA1, SA2 are joined together on the plate as seen in stitch regions JA and JB, within superimposed stitch regions SA1', SA2' on the plate. The end portions of the wiring pattern Va1 and the thickened end portions of the wiring pattern Va2 overlap in the X direction by roughly a few millimeters, and the thickened end portions of the wiring pattern Vb1 and the end portions of the wiring pattern Vb2 overlap in the X direction by roughly a few millimeters (two-fold exposure) as shown in FIGS. 1G and H.

Furthermore, because the wiring pattern groups within the end portions CN1, CN2, CN3 are all outside the display region, it is not necessary to make the pattern shape of the stitch portion such that the joint is imperceptible. It is understood that, instead of joining the end portions of each wiring pattern as shown in circles FIGS. 1C–H, and making the enveloping curve wholly in polygonal line form, the joint may simply be in a straight line. Whatever the form of the enveloping curve, the respective pattern shape will be complimentary with respect to the X direction within each stitch region SA1, SA2.

In this way according to an embodiment of the present invention, when each wiring portion is thickened at the end portion in the manner of Vb1, Va2, each transfer image PA1 and PA2 positioned adjacent to the stitch portion JA, or each transfer image PA2 and PA3 positioned adjacent of the stitch portion JB on the plate can account for joint error due to the relative residual alignment error (for example, ±0.5 μm in the X direction, ±0.6 μm in the Y direction), and reduces the risk of open circuits and the like.

According to another embodiment of the present invention, the methods disclosed in detail in JP-A-S63-160331 or JP-A-S63-312636, in relation to the optimization of the stitch exposure, and other methods disclosed in detail in JP-A-S63-211623 or JP-A-H1-227432 (U.S. Pat. No. 4,982,227, which is incorporated by reference) are applied, with suitable modifications, to the present invention.

As previously mentioned, wiring pattern groups formed in the end pattern portions CN1–CN3 usually are driver (or source) wiring of thin film transistors in order to drive various display pixels, and extend in the Y direction as shown in FIG. 1. For this purpose, wiring patterns are formed extending in the X direction, and the thin film driver IC circuits and the like formed in the terminal pattern portions CN1–CN3 are inserted together onto the plate in a lithographic process.

In the collective pattern region PA shown in FIG. 1, for the pattern configuration in the pixel portion prescribed by the horizontal line HL within the stitch regions SA1, SA2, as shown in the circles BL, BR in FIGS. 1C and F, the pattern configurations are complementary in the X direction and are in a random interfitting relationship. For example, the pattern formed within these circles BL, BR are the gate of a transistor included in each pixel shown in FIG. 1G. The shown gate wiring is connected in common across horizontal scan line units.

As shown in the circles BL, BR of FIGS. 1C and F, for example, the specific gate pattern Vc1 formed within the stitch region SA1 on the left side, and the specific gate pattern Vc2 formed within the stitch region SA2 on the right side, are patterns to be rectilinearly joined as shown in the circle CP of FIG. 1G. The number of divisions is determined by taking the integer of the stitch region divided by the pixel size. This division divides the gate line pattern to be formed within the transfer image regions SA1', SA2', which form the stitch portions JA, JB, by randomly distributing the individual division pattern elements such that the joints in the pixel regions are inconspicuous.

Accordingly, the pattern portion formed within the stitch region SA1 on the left side on the mask, and the pattern portion formed within the stitch region SA2 on the right side on the mask, is patterned in a stepping-stone intermitting relationship. It is further desirable to make the distribution of divisions for each gate line pattern random in the Y direction.

When transferring onto the plate by scan exposing the collective pattern region PA, an exposure visual field ExS having arcuate slit shape moves in the Y direction (also shown by arrow DS). The plate is on a plate stage that moves the plate with a roughly uniform speed in the Y direction and can step with precision in the X direction. During scan exposure, the mask and plate move in the direction of the arrow Ds at a constant speed. This scan exposes the image PA1 of the collective pattern region PA onto the plate.

Next, in order to overlap with the projected image of the left side on the mask substrate, without changing the relative positional relationship (alignment state) of the mask stage and plate stage in the Y direction, the plate stage is stepped with an accuracy of about ±0.5 μm in the X direction. Then, the transfer image PA2 of the same collective pattern region PA on the mask is scanned onto the plate by a second scanning exposure. Repeating the stepping and scanning exposures in the same manner, a transfer image PA3 of the collective pattern region PA is formed joined to the transfer image PA2 to form the display device shown in FIG. 1B.

In this manner, according to the above embodiment of the present invention, by using three smaller exposure operations (three scanning exposures and two stepping movements are shown), a larger display portion of the liquid crystal device having an oblong display region with the long side in the X direction is formed on the plate. For instance, when the width dimension in the X direction of the collective pattern region PA is about 35–40 cm, since the shown projection magnification of the mirror projection type exposure device is about an equal scale, it becomes possible to make a display device of transverse width (dimension in the horizontal scan HL direction) of 90 cm or more.

Furthermore, the maximum display dimension in the perpendicular scan line direction (Y direction) of a display device is limited by the scanning movement stroke of the mask stage and plate stage in the Y direction, which is within the peripheral end pattern portions contained in the collective pattern region PA. If the circuit design is placed so as to omit the top and/or bottom terminal portions, the Y direction dimension of the display region can be enlarged and a display device with a larger display picture surface can be manufactured.

However, using only the collective pattern region PA of FIG. 1, it is difficult to form a complete pattern for use in display device. Accordingly, a mask M as shown in FIG. 2 is prepared according to another embodiment of the present invention. FIG. 2 shows pattern regions PAL and PAR that are separate from the collective pattern region PA. Pattern regions PAL and PAR contain the end pattern portions to be joined at the left and right ends of the whole display region formed on the plate P.

In each terminal portion pattern region PAL, PAR, plural terminal portions CN4, CN5, CN6 are formed in order to connect relay tab sheets (flexible printed circuit sheets) to the gate lines of each respective horizontal line to a driver circuit, and to connect pixel pattern portions near the outer edge by stitch exposing these to the display region of the collective pattern region PA. Moreover, the terminal portion patterns CN4, CN6 in the respective terminal portion pattern regions PAL, PAR connect with the respective top and bottom terminal portion patterns CN1, CN3 after stitch exposure.

As shown in FIGS. 2C–F, the pattern shapes of the display pixels formed within the stitch regions SA1, SA2 of the collective pattern region PA are mutually complementary in the X direction in a random stepping-stone intermitting relationship as described above. As shown in FIGS. 2C and D, the pattern shape of the display pixels formed within the stitch region SA1 of the right terminal pattern region PAL is complementary to the pattern shape within the left stitch region SA1 of the collective pattern region PA.

Basically, the pattern shape (within circle BR2) of FIG. 2D of the display portion formed within the stitch region SA1 of the terminal portion pattern region PAL has the same pattern shape as the that (within circle BR1 of FIG. 2E) within the right stitch region SA2 of the collective pattern region PA. Similarly, the pattern shape (within circle BL2 of FIG. 2F) of the display portion formed within the stitch region SA2 of the right terminal portion pattern region PAR is complementary to the pattern shape (within circle BL1 of FIG. 2C) within the left side stitch region SA2 of the collective pattern region PA. This results in a random stepping-stone interfitting relationship such that the pattern shape (e.g., within circle BL2) of the display formed within the stitch region SA2 of the terminal portion pattern region PAR has the same pattern shape (e.g., within circle BL1) of the right stitch region SA1 of the collective pattern region PA.

Moreover, light barrier portions SBL, SBR are formed on the mask M between the respective terminal portion pattern regions PAL, PAR and the collective pattern region PA. Light barriers are also formed with a predetermined width in the peripheral portions of the respective pattern regions PA, PAL, PAR. The width of a light barrier SBL (SBR) in the X direction during the scan exposure is determined by taking into account the indistinct width when shielded by the light shielding member (movable blind) of the peripheral visual field portion ExS1 (ExS2) of the arcuate slit shaped exposure visual field ExS.

According to the above embodiment of the present invention, a display device is formed on a plate P using the mask M shown in FIG. 2 by transferring images PA1, PA2, PA3 of the collective pattern region PA. These images PA1, PA2, PA3 have been respectively stitch exposed onto the plate P using three scanning exposures and two stepping movements as described above. Then, the light barrier member is adjusted such that only the exposure visual field ExS1 (which has an X direction dimension in the X direction rather that is greater than the width of the terminal portion pattern region PAL) of the exposure visual field ExS becomes effective as shown in FIG. 2A.

The plate stage is then stepped in the X direction without upsetting the relative positional relationship of the mask M and plate P in the Y direction. The position of the mask stage M and the plate P is set such that the projected image of the stitch region SA1 of the terminal portion pattern region PAL accurately overlaps the left stitch region SA1' of the transfer image PA1 which has already been exposed.

Then, by scanning the mask M and plate P at a uniform speed in the Y direction with respect to the projection system, the projection image of the terminal portion pattern region PAL is stitch exposed to the transferred image PA1 on the plate P, using the restricted peripheral visual field portion ExS1 to form joint JC shown in FIG. 2G. The plate stage is again stepped, and similarly, the projection image of the terminal portion pattern region PAR of the mask M is scan exposed to join the right stitch region SA2' of the transfer image PA3 on the plate P to form joint JD shown in FIG. 2H.

Accordingly, in the above embodiment, it is possible to transfer the whole pattern of a display device onto a plate P using a practical mask M by five scan exposures and four stepping movements. In addition, since the patterning of the stitch portions JC, JD at which the respective transfer images PAL', PAR' of the terminal portion pattern regions PAL, PAR are joined in the same way as the stitch portions JA, JB shown in FIG. 1, the joint is relatively inconspicuous.

The division configuration of the mask pattern and the configuration of the stitch exposure described hereinabove are merely one example. The configuration of the division of the mask pattern and the movement stroke of the exposure device, or the size or shape of the exposure visual field ExS, can be freely set. Depending on the circumstance, it is understood that by placing and forming the collective pattern region PA and the respective terminal portion pattern regions PAL, PAR on separate mask substrates, it is also possible to perform stitch exposure by changing the masks instead of using one mask.

FIG. 3 shows a schematic representation of a mirror projection type exposure device that uses the mask M of FIG. 2. In this embodiment, a mirror projection type exposure device is exemplified as the projection exposure device PL, which uses a prior art Offner type of equal magnification projection system using planar mirrors MR1, MR4, a concave mirror MR2, and a convex mirror MR3. However, if the exposure device has a comparatively large exposure visual field, the exposure device may also be equipped with a reflection-refraction type of projection system or a wholly refractive type of projection system. Details of this will be described below.

As shown in FIG. 3, the illuminating light, which is formed into an arcuate shape, is provided by the illuminating system 10. The illumination light is reflected by the mirror 11, and is incident on the condenser system 12. The light from the condenser system 12 is incident with uniform intensity in circular arcuate slit form on the mask M. The mask M is placed in a mask stage 15, which moves with a large stroke in the Y direction and with fine movements in the X direction and θ direction (θ direction is the rotation around the Z axis perpendicular to the surface of the mask substrate).

The mask stage 15 is moved by a drive unit 16 containing a linear motor or the like actuator. The coordinate position (X-Y-θ) of the mask stage 15 is sequentially measured with a multi-axial interferometer 17, and this measurement information is sent as feedback signals to an exposure control unit 30 containing a computer and used for the servo control of the drive unit 16.

The imaging light beams from the mask M are reflected by the planar mirror MR1, concave mirror MR2, convex mirror MR3, and planar mirror MR4 in succession in the projection optical system PL. The image in the arcuate slit shaped exposure visual field ExS is then scanned onto the plate P.

The plate P is positioned on the plate stage 20, which is movable in two dimensions (X and Y). The plate stage 20 is controlled by a drive unit 21 containing a linear motor or the actuator. The coordinate position (XYθ) of the plate stage 20 is sequentially measured with a multi-axial interferometer unit 22. The measurement information from this laser interferometer unit 22 is sent to the exposure control unit 30, and is used for the servo control of the drive unit 21.

A blind member AP, which selectively screens a portion of the arcuate slit shaped exposure visual field ExS, is arranged in the light path close to the imaging surface within the projection optical system PL. This blind member AP is moved by means of a drive mechanism 18 according to instruction values from the exposure control unit 30 in order to set the screened region (or effective illumination region). As previously described in FIG. 2, the blind member AP is used for screening to create the peripheral portions ExS1, ExS2 of the projection visual field ExS and screening the remainder of visual field ExS. The blind member AP also screens both peripheral portions ExS1, ExS2 together, making the remaining central portion of visual field ExS effective. Furthermore, the movable blind member AP may be in the upper side (the illuminating system 10 side), close to the mask M, in a position optically conjugate to the pattern surface of the mask M within the illuminating system 10 for exposure use.

In the shown exposure device, because it is necessary for the mask stage 15 and the plate stage 20 to move at a uniform speed in the Y direction with predetermined synchronous accuracy, the exposure control unit 30 has two loops, a speed feedback and a position feedback, to cause the plate stage 20 to move at a constant speed in the Y direction, and to control the drive unit 16 based on the difference amount of the Y direction coordinate of the measurement information from the interferometer units 17, 22, with the movement position of the mask stage 15 in the Y direction following the Y direction movement position of the plate stage 20, within the normally synchronous accuracy.

The mask stage 15 and plate stage 16 are also servo controlled by sequentially calculating the relative position error of the mask stage 15 and plate stage 16 in the X direction and the θ rotation error based on the measurement information from the interferometer units 17, 22, and keeping this position error and θ error within the tolerance range. Moreover, while stepping the plate stage 20 in the X direction, the respective drive units 16, 21 are servo controlled so as not to change the relative positional relationship of the mask stage 15 and the plate stage 20 in the Y direction or the relative θ position error by servo controlling the X direction actuator of the drive unit 21.

The exposure device does not use an alignment microscope (alignment sensor) for photoelectrically detecting marks on the mask M and the plate P to determine the relative positional relationship. However, this kind of alignment sensor is disposed similarly to the prior art devices.

Furthermore, while an autofocus sensor for detecting deviation of the plate P or mask M from the focus position is also omitted, these also are similarly known in the prior art exposure devices.

In addition, because the display device is a rectangular and is longer in the X direction, the movement stroke of the plate stage 20 in the X direction corresponds to this dimension. For the shown embodiment, the stroke necessarily becomes longer than the movement stroke in the Y direction (scan exposure stroke).

Moreover, the light source in the illuminating system 10 is a mercury discharge lamp, a xenon lamp, or an ultraviolet laser and the like. For a mercury discharge lamp, the g line is at 436 nm, the h line is at 405 nm, or the i line is at 365 nm and the like independent emission lines, or continuous emission ultraviolet light mixing plural of these emission lines, may be selected.

For an ultraviolet laser, because many ultraviolet light lasers operate with pulsed light generation, it is necessary to have the pulse frequency (trigger period between pulses) suitable for the scanning speed of the mask and plate, the width in the Y direction of the arcuate slit shaped exposure visual field ExS, and/or to optimize the scanning speed according to the pulse generation frequency.

Figure 4A:
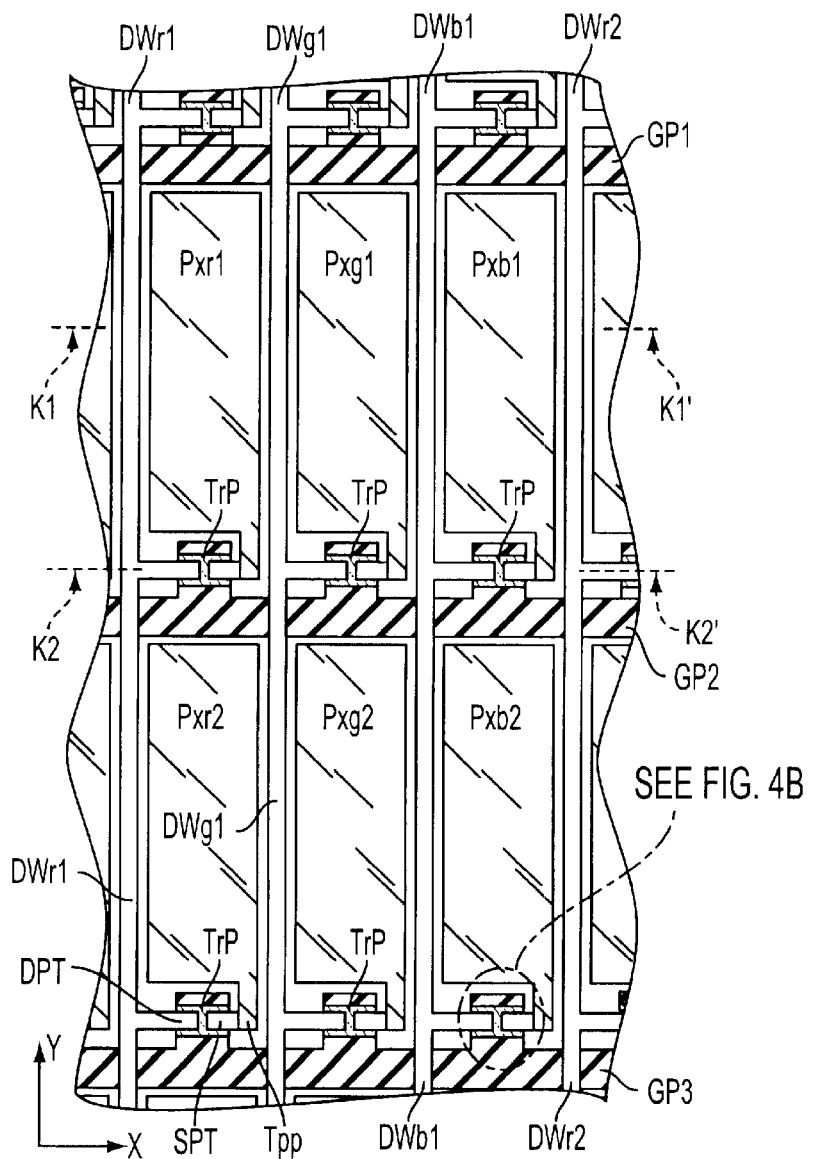
FIGS. 4A and B are partial enlargements showing the planar construction of a TFT type liquid crystal device.

The circuit pattern of the display portion of a presently manufactured typical TFT type liquid crystal display device has a flat structure. As shown in FIG. 4A, which is a partial enlarged diagram of the pattern of two pixel cell units portions and a transistor pattern formed on the color plate of a liquid crystal device, (a color display device is assumed) the pixel cell units have an upper row of cells Pxr1, Pxg1, Pxb1 pixel cells Pxr2, Pxg2, Pxb2 respectively corresponding to three RGB primary colors (red, green, blue), and a lower row.

These pixel cells Pxr1, Pxg1, Pxb1, Pxr2, Pxg2, Pxb3 are made with ITO films, and are formed as rectangles having a length of 200–350 μm in the Y direction and a length in the X direction of 60–100 μm. Moreover, a drain wiring pattern DWr1, DWg1, DWb1, DWr2, . . . is formed running parallel in the vertical direction between each pixel cell from the uppermost portion to the lowermost portion of the display picture surface. Respective drain electrodes DPT of the respective accessory transistors of the cell neighbors of the same color (Pxr1 and PxR2, Pxg1 and Pxg2, Pxb1 and Pxb2 neighbors) and a portion of the drain wiring patterns DWr1, DWg1, DWb1 are made extending in the X direction.

In the right lower portion of the respective pixel cells Pxr1, Pxg1, Pxb1, Pxr2, Pxg2, Pxb2, salient portions Tpp are disposed in order to electrically connect with the source electrode portion SPT of transistors disposed in each respective pixel cell. Amorphous silicon (a-Si) layers TrP are formed which function as transistors in the lower layer of the drain electrode portions DPT and the source electrode portions SPT, and gate wiring patterns GP1, GP2, GP3, are formed so as to pass in the X direction between each pixel cell, with interposed red, green, blue below this a-Si layer TrP.

This gate wiring patterns GP1, GP2, GP3 are formed so as to extend along the whole width of the picture surface of the display device, with one gate wiring pattern corresponding to one horizontal scan line HL. In this kind of typical circuit constitution, the respective pixel cells Pxr1, Pxg1, Pxb1, Pxr2, Pxg2, Pxb2, formed with ITO film, are transparent liquid crystal electrode patterns in order to cause a change in transparency in this portion. This transparency is changed by varying the electrical characteristics of the amorphous silicon transistors (a-Si layer TrP).

Figure 4B:
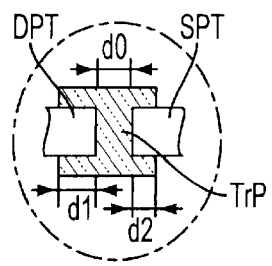

The electrical characteristics of the transistors change in dependence on the relative position joining accuracy of the drain electrode portions DPT and the source electrode portions SPT formed by superimposed exposure on a-Si layer TrP. As shown, in FIG. 4B, when the line width of the drain electrode portion DTP and the source electrode portion SPT is the same in the Y direction, the drain electrode DPT width d1 and the source electrode SPT width d2 are superimposed on the a-Si layer Tr, and the difference is gap d0 between the drain electrode portion DPT and source electrode portion SPT.

Normally, because the drain electrode portion DTP and the source electrode portion SPT are formed on the same mask pattern, the gap d0 can be the same for any of the transistors. The widths d1, d2, if transferred between transistors in one scan exposure, all have about the same value. However, if they are formed between transistors by different scan exposures, the widths d1, d2 differ slightly in value, and this difference causes differences to arise in the electrical characteristics of the transistors (amplification factor or conductance, etc.).

As a result, when comparing the cell portions in two scan exposed picture surfaces, even when the same drive voltage is applied to respective transistors (drain) of the left cell portion and the right cell portion of a joint, the transparency of portions of the liquid crystal medium differs slightly in these facing cell portions. This difference is recognized as a contrast difference on the display picture surface. Accordingly, by making the enveloping curve which joins end portions of patterns joined by stitch portions either a simple straight line form, the polygonal line form, or the wavy line form, a joint line is visible along this enveloping curve according to the degree of contrast difference of both sides of the stitch portion.

When using the stitch exposure method according to the present invention, in display portions within the stitch regions JA, JB, JC, JD on the plate, since the pixels having contrast differences in the stitch direction (X direction) and/or the cells are lined up in a random interfitting state, this random interfitting state differ between respective horizontal scan lines and distinct joint lines within respective stitch regions JA, JB, JC, JD are not created.

Figure 5A:
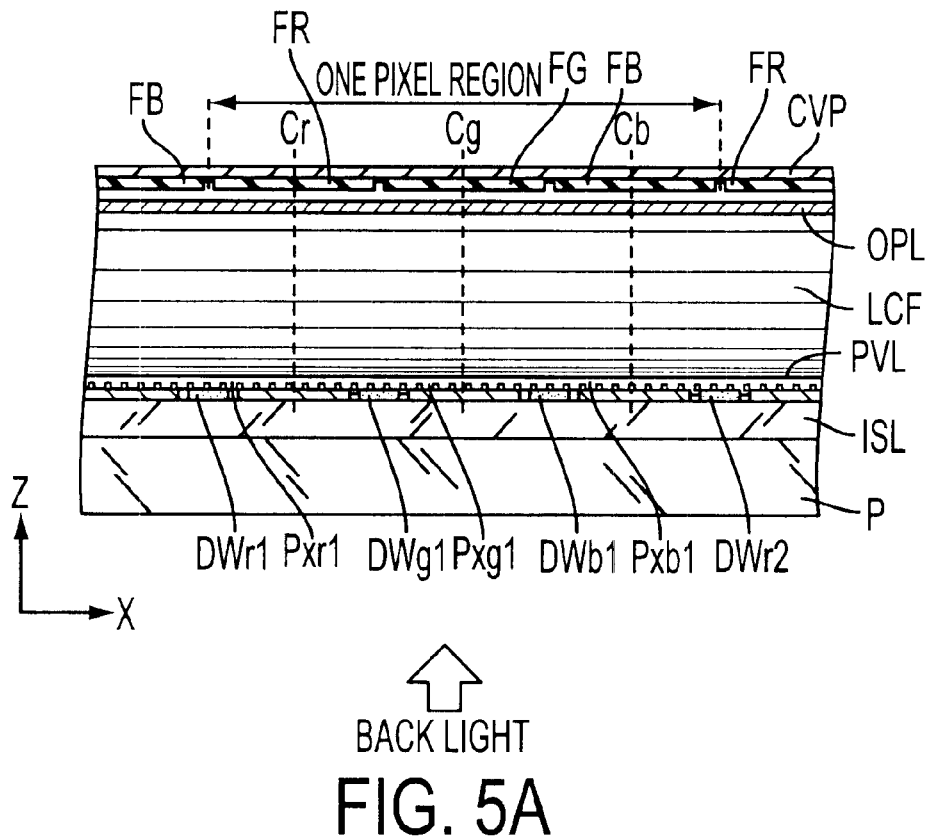
FIGS. 5A and 5B respectively show enlarged cross sections K1–K1' and K2–K2' of the display pixel cell unit of a liquid crystal display device shown in FIG. 4A.
Figure 5B:
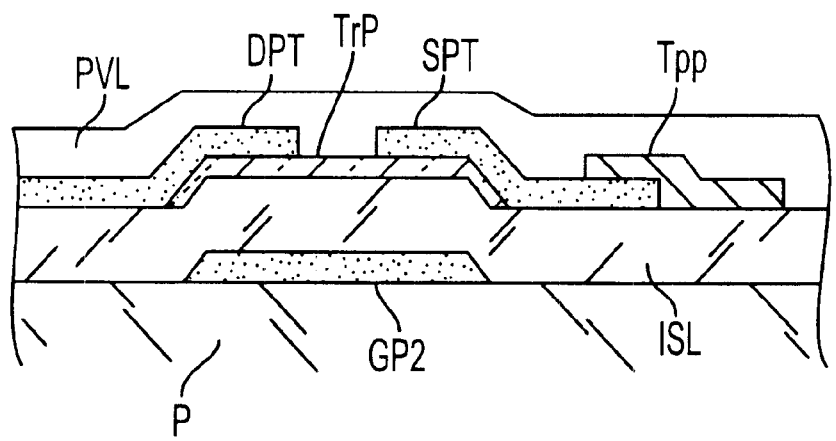

The structure shown in FIG. 4A represents an electrode pattern (cells of ITO film) for use in a pixel and a pattern use for a transistor formed on a glass plate. Typically, they have the cross sectional structure of an actual liquid crystal device as shown in FIG. 5(A). FIG. 5(A) shows a partial cross section of a liquid crystal device corresponding to the arrows K1–K1' in FIG. 4A. FIG. 5(B) represents a transistor portion corresponding to the view K2–K2' in FIG. 4A.

In FIG. 5(A), an insulating film ISL of uniform thickness is formed on the upper surface of the display portion of a glass plate P. The drain wiring patterns DWr1, DWg1, DWb1, DWr2, . . . and the cells (ITO electrode films) Pxr1, Pxg1, Pxb1, . . . shown in FIG. 4A are formed on the insulating film ISL. In addition, an insulating protective transparent film in the form passivation layer PVL is formed with uniform thickness by vapor deposition on the whole display portion.

A transparent electrode film OPL, which maintains a constant interval, and a color filter plate CVP are arranged above the passivation layer PVL. The transparent electrode film OPL and color filter plate CVP are supported on the plate P so as to integrally cover the whole surface of the display region, and a TFT type liquid crystal medium LCF is filled into the space (about a few $\mu$m) sealed between the passivation layer PVL and the transparent electrode film OPL.

On the lower surface of the color filter plate CVP, there are arranged opposite each cell constituting each pixel the cells of the three primary colors Pxr1, Pxg1, Pxb1, respectively, about the same width of stripe-shaped color filter layers FR (red), FG (green), FB (blue). The filter plate CVP is arranged at respective center points of the cells Pxr1, Pxg1, Pxb1, and the respective center points of the color filter layers FR, FG, FB, are mounted on the plate P, aligned in the XYθ directions, such that the respective center lines Cr, Cg, Cb are aligned.

In such a structure, when illuminated with backlight light of uniform intensity directed toward the color filter plate CVP from the lower side of the plate P, a display image can be seen from the color filter plate CVP side. At this time, in one pixel region, when providing an individual electrical potential to the cells Pxr1, Pxg1, Pxb1 with the transparent electrode plate OPL as a common potential, the transparency existing in the liquid crystal medium LCF of the portion facing the respective cells Pxr1, Pxg1, Pxb1 changes, and the transmission intensity of the backlight light transmitted to the respective filter layers FR, FG, FB changes. By this means, the composite ratio of the three primary colors is adjusted and the hue and brightness of one pixel are set.

Because the size of this one pixel is a rectangle of roughly about 300 $\mu$m$^2$ or less on the display picture surface, the separation of the three primary colors of each pixel cell is not visible to the human eye, and is visible with the hue adjusted at one point and the luminosity adjusted to shine. Of course, when the display picture surface is observed enlarged with a microscope or the like, the three primary colors in the pixel can be separately seen.

In the cross sectional structure of a transistor as shown in FIG. 5(B), a gate wiring pattern GP2 is formed of metal material on the upper surface of a glass plate P, and an insulating film ISL of uniform thickness is formed on this. A gate wiring pattern GP2 and aligning a-Si layer TrP are formed on the insulating layer ISL, the drain wiring pattern DPT and a source wiring pattern SPT are also formed on the insulating layer ISL.

An n+a-Si layer is superimposed on the a-Si layer TrP, and electrical conduction is maintained between the drain/source electrode and the a-Si layer TrP. Moreover, the portion consisting of the channel of the transistor, in order to eliminate a corresponding portion of the n+a-Si layer in an etching process of a metal layer, the drain electrode and the source electrode do not conduct via the n+a-Si layer.

After this, a drain wiring pattern Pxr1, Pxg1, Pxb1, . . . and gate pattern GP1, GP2, GP3 as shown in FIG. 4A, are formed in each square respectively divided in matrix form, and the pattern of cells Pxr1, Pxg1, Pxb1 is formed by means of ITO film. The respective cells Pxr1, Pxg1, Pxb1 are aligned such that there is a constant area of overlap in the upper portion of the source electrode pattern SPT corresponding to the right lower projecting portions Tpp.

Figure 6:
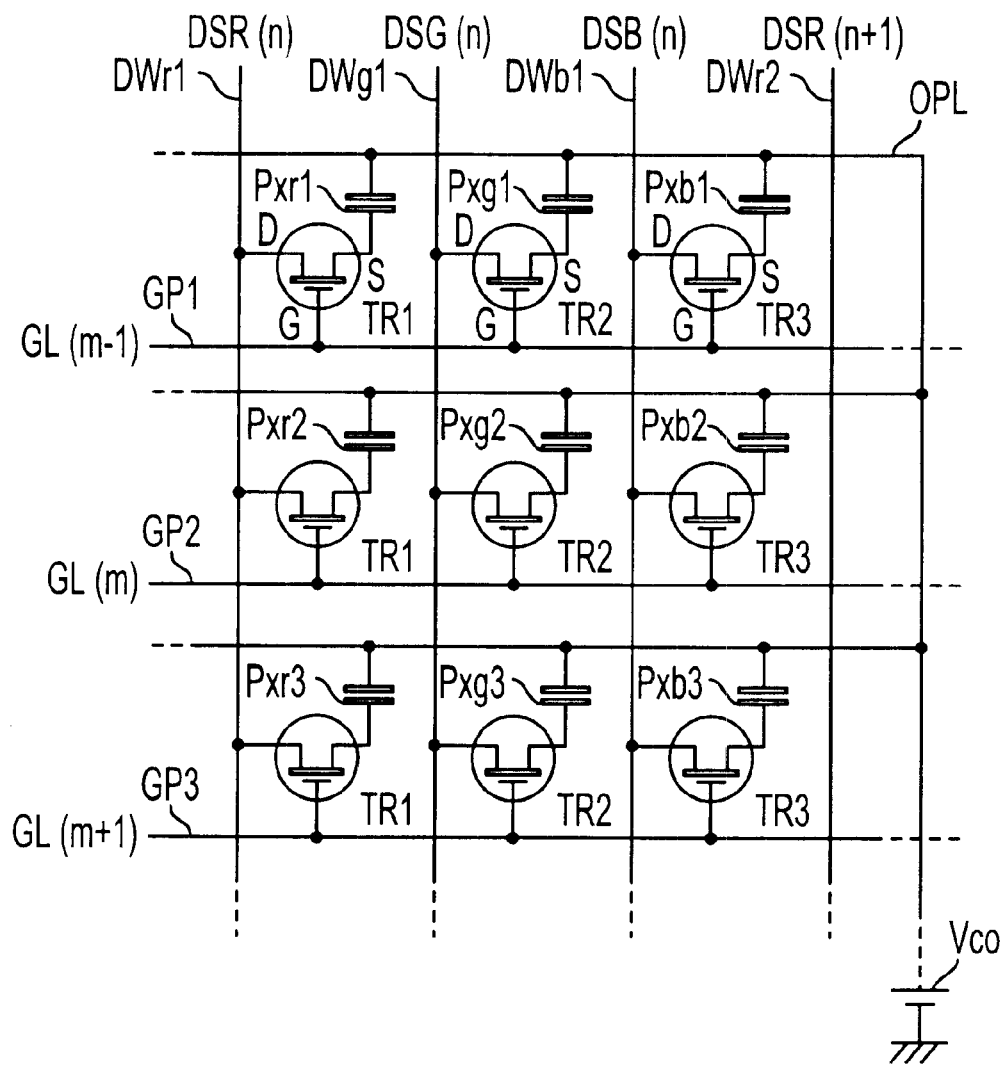
FIG. 6 is a circuit diagram schematically illustrating the equivalent electrical circuit of a display pixel cell units of the liquid crystal display device shown in FIGS. 4 and 5.

The electrical equivalent circuit of the pixel cell units of the liquid crystal device manufactured in this manner is shown in FIG. 6. At the respective crossing points of the gate wiring pattern GP1, GP2, GP3 of each respective horizontal scan line and the drain wiring pattern DWr1, DWg1, DWb1 of each cell of the same color arrayed in the vertical direction, connecting the respective gates G and drains D of the transistors TR1, TR2, TR3 used for switching between the source S of the respective transistors TR1, TR2, TR3 and a common potential Vco. The respective transistors further have of a capacitive load (capacitor) connected at the transparent electrode film OPL, the cells Pxr1, Pxg1, Pxb1, Pxr2, Pxg2, Pxb2, Pxr3, Pxg3, Pxb3 and the liquid crystal medium LCF.

In such a circuit, the potential to be provided to the drain wiring pattern DWr1, DWg1, DWb1, DWr2 of each cell arrayed transversely is sent from the driver circuit along the transverse direction drive lines DSR(n), DSG(n), DSB(n), DSR(n+1) and creates an analog voltage supply, simultaneously, before scan commencement of one horizontal scan line portion, according to the luminosity of each cell in the transverse direction. At the scan commencement time for the horizontal scan line, by supplying a pulse signal instantaneously to the corresponding gate wiring pattern, the transistors TR1, TR2, TR3 of each cell in the whole pixel along this horizontal scan line are simultaneously placed in a conductive state, each cell of one horizontal scan line portion stores the analog voltage in the capacitor.

Because of this, in each gate line pattern GP1, GP2, GP3, a pulse signal is supplied with respect to one horizontal scan line selected via the vertical direction drive lines GL(m−1), GL(m), GL(m+1). As an example of such a drive circuit, a shift register circuit supplies pulse signals in turn from above to below, or from below to above, to the respective drive lines GL(m−1), GL(m), GL(m+1) arrayed in a top to bottom direction within the end portions of the left side (or right side) of the display picture region.

On the other hand, the analog voltage supplied to the horizontal direction drive lines DSR(n), DSG(n), DSB(n), DSR(n+1), cuts off as a voltage to be supplied to each cell, based on the luminosity signal in the image signal and the color signal, and is operated via an analog shift register circuit which simultaneously holds this.

The above respective drain circuits are arranged on the back side, outside the display pixel region of the plate P, in order to reduce the width of the frame portion of the display device. Due to this, via a tab for wiring use made from a flexible printed circuit board, the transverse direction drive lines DSR(n), DSG(n), DSB(n), DSR(n+1) are connected to the vertical direction drive lines GL(m−1), GL(m), GL(m+1).

Additional layers (previously described n+a-Si layer and the like) have other structures and are also formed in actual transistors. By superimposed exposure (but with a different mask pattern), these other typical layers necessary to form the circuit pattern are formed. Four representative kinds of these layers are shown in FIGS. 5(A), (B), [1] gate wiring pattern Gp1, Gp2, GP3, [2] a-Si layer TrP, [3] drain wiring pattern DWr1, DWg1, DWb1, drain electrode portion DPT, source electrode portion SPT, [4] cell Pxr1, Pxg1, Pxb1.

Accordingly, in order to form the necessary circuit patterns on a plate P for use in a liquid crystal device, at least four mask substrates (namely four kinds of mask patterns) are necessary. The pattern configurations of the display portion of these four kinds of mask substrates are shown in FIGS. 7A–H, corresponding to the previous FIG. 4A. In FIG. 7, superimposed exposures of a first mask M1 which transfers a gate line pattern, a second mask which transfers an a-Si layer pattern, a third mask M3 which transfers a source/drain pattern, then a fourth mask M4 which transfers a cell pattern, are successively performed.

Figure 7A:
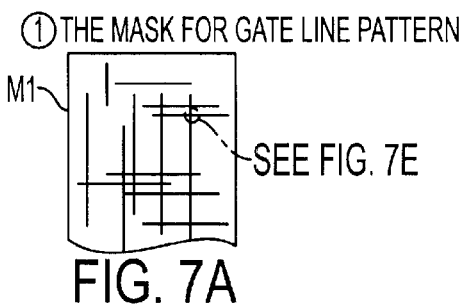
FIGS. 7A–H illustrate the configuration and arrangement of the gate line, the a-Si layer, source/drain, and cell patterns on respective masks used to expose respective layers to manufacture a liquid crystal display device according to an embodiment of the present invention.
Figure 7B:
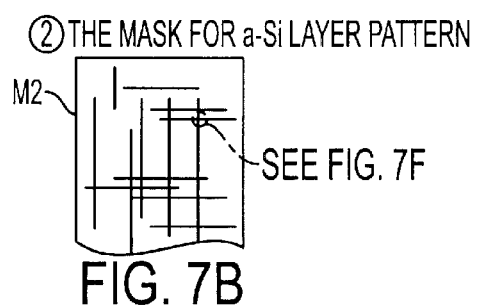
Figure 7C:
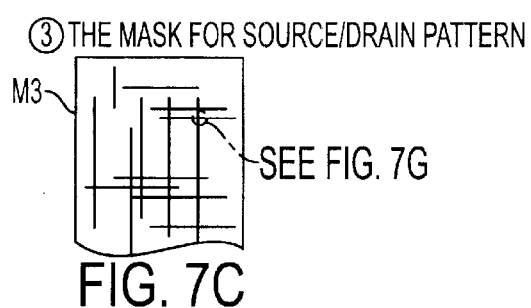
Figure 7D:
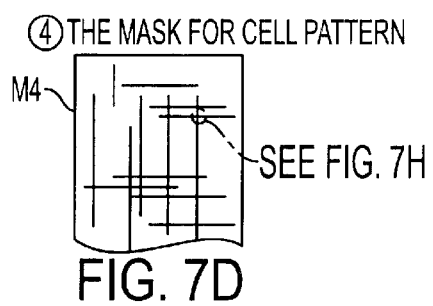
Figure 7E:
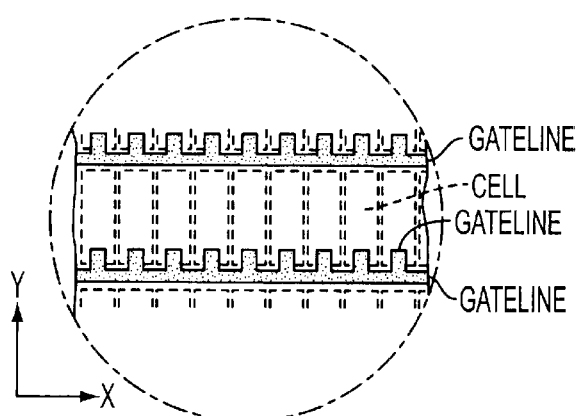
Figure 7F:
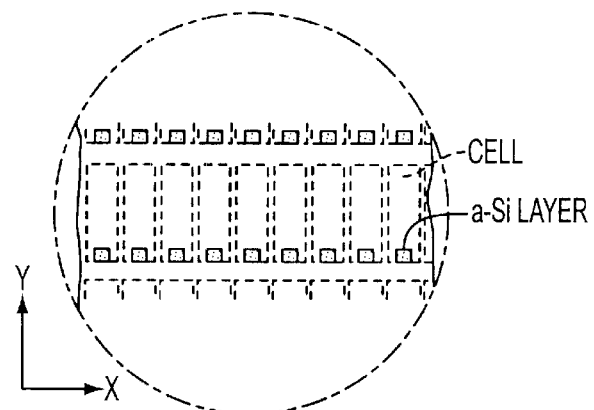
Figure 7G:
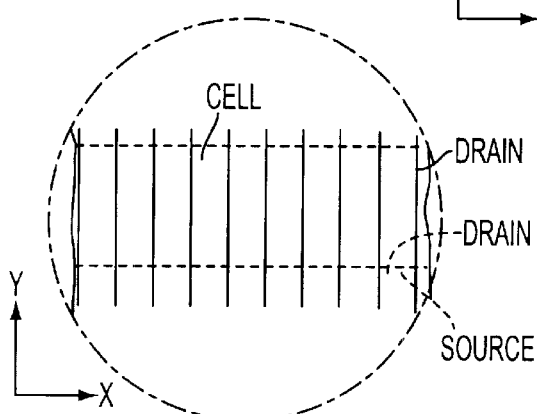
Figure 7H:
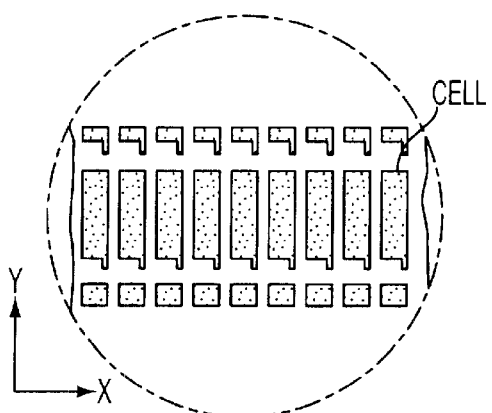

In these four kinds of mask patterns, the darkened portions in FIGS. 7E, F and H are vapor deposited chromium layers formed as screening portions. Alternately, the darkened portions may be formed as transparent portions with the whole surroundings as screening portions. In relation to this, the process or resist of the layers to be exposed is decided on as negative-positive.

In either case, on a plate exposed using a positive mask M1, during the successive superimposed exposure of mask substrates M2–M4, as a general rule, the pattern of the next mask is accurately combined in position with respect to the pattern on the previously transferred plate with a permitted alignment accuracy (for example, ±0.5 $\mu$m at 3σ).

However, the pattern of pixel portions of each layer shown in FIGS. 7A–D represents the form outside the spike portion within any display picture surface. As previously described with reference to FIGS. 1 and 2, the pattern formed within the stitch regions SA1, SA2 on the mask is in a complementary random interfitting relationship in the X direction. For the four mask substrates M1–M4 shown in FIG. 7, there are respectively formed on each mask at the same external dimension the collective pattern region PA, the left terminal portion pattern region PAL, and the right terminal portion pattern region PAR, in the pixel portion within the stitch regions SA1, SA2 of the respective pattern regions PAS, PAL, PAR, in the conditions as described for FIG. 2, to be in a random intermitting relationship such that the pattern becomes granularized.

Figure 8:
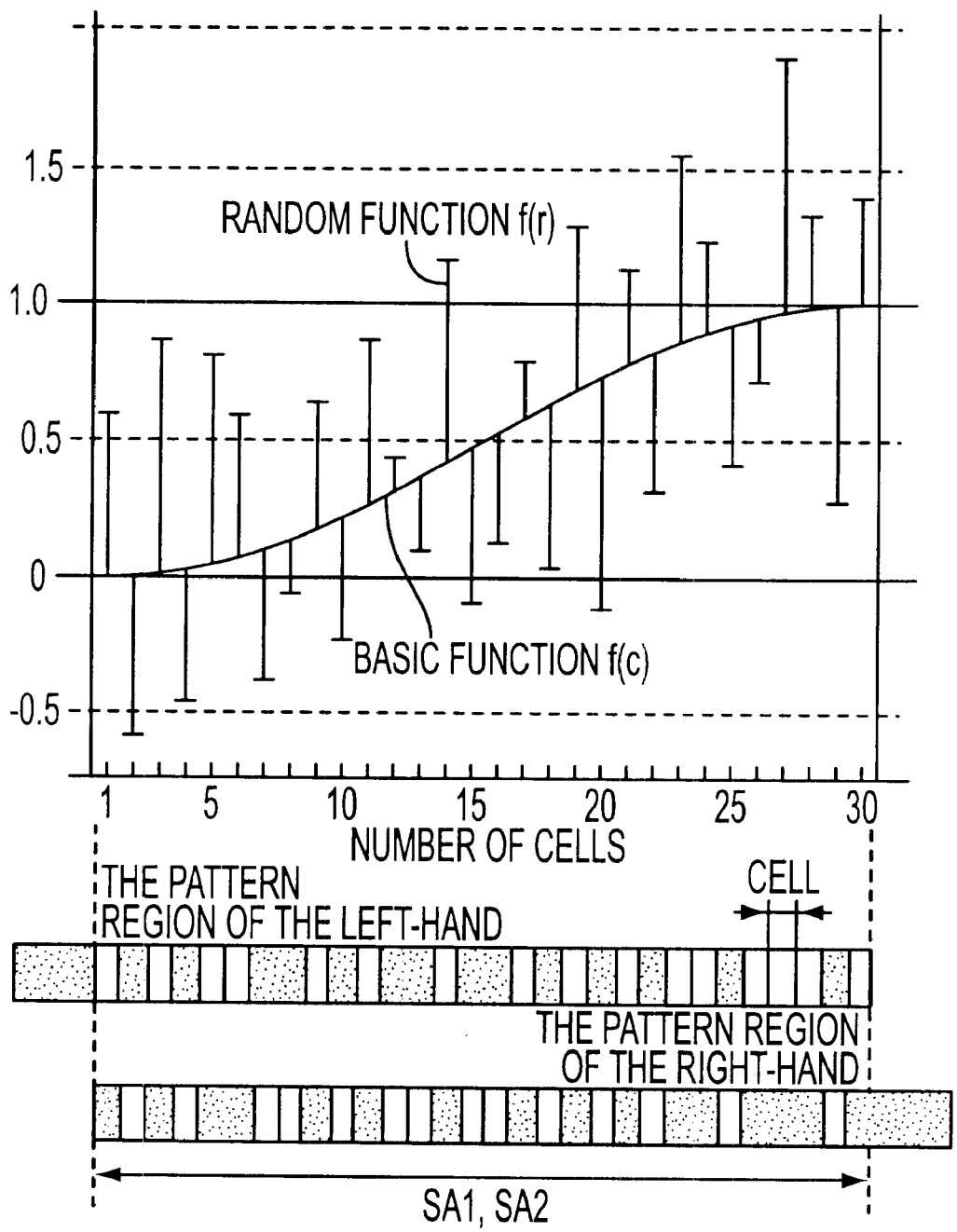
FIG. 8 illustrates the process of dividing in random stepping-stone fashion the pattern of a stitch portion formed on a mask by stitch exposing two mask patterns according to an embodiment of the present invention.

A description is therefore given with reference to FIG. 8 as regards the specific method of pattern granularization of the pixel portions within the stitch regions SA1, SA2. As shown, assuming the number of pixel cells present in the X direction within the stitch regions SA1, SA2 on a mask is 30 (the number of pixels is 10), the stitch portion pattern belonging to the left pattern region, and the right pattern region of the stitch region are respectively granularized by cell units.

In FIG. 8, the abscissa of the graph shows the number of cells within the stitch regions SA1, SA2, and a basis function f(c) is chosen such that it becomes 0 at the position of the left-most (first) cell, and becomes 1 at the position of the right-most (30) cell. This basis function f(c) is set, in the case of FIG. 8, as the 180° waveform of a sine wave. However, the basis function could also be a ½ approximation waveform of a Gaussian wave, a polygonal line approximation waveform, a portion of a multifunctional waveform, or a simple straight line waveform.

Then, a random function f(r) taking values in the range −1 to +1 is added to the basis function f(c) at the value (0–1) of each respective cell position. If the result is smaller than a stitch level of 0.5, the division pattern element of this cell position belongs to the left pattern region. If the result is greater than the stitch level of 0.5, sets the division pattern element of this cell position as belonging to the right pattern region.

In this manner, in mutually overlapping exposed stitch regions, as shown in the lower portion of FIG. 8 cell units with granularized pattern elements are formed in a random stepping-stone complementary relationship. Namely, for a dark color cell unit formed within the stitch regions SA1, SA2, where the positions of the cell units belonging to the right pattern VC2 are taken as empty, the positions of the cell units corresponding to the stitch regions SA1, SA2 belonging to the left pattern VC1 are taken as dark.

By performing a similar operation for all the horizontal scan lines within the stitch regions SA1, SA2, and by causing the output values of the random function f(r) to differ and arraying the division pattern elements of cell units in the vertical scan line direction (Y direction), division pattern elements can be distributed either belonging to the left pattern region VC1 or belonging to the right pattern region VC2. In this manner, the arrangement of the granularized division pattern elements formed in the stitch regions SA1, SA2 makes the distribution probability of division pattern elements belonging to the left stitch region high on the left side of the stitch region, and low on the right side of the stitch region, and results in a smoother contrast difference at the stitch portions on the display picture surface.

Figure 9A:
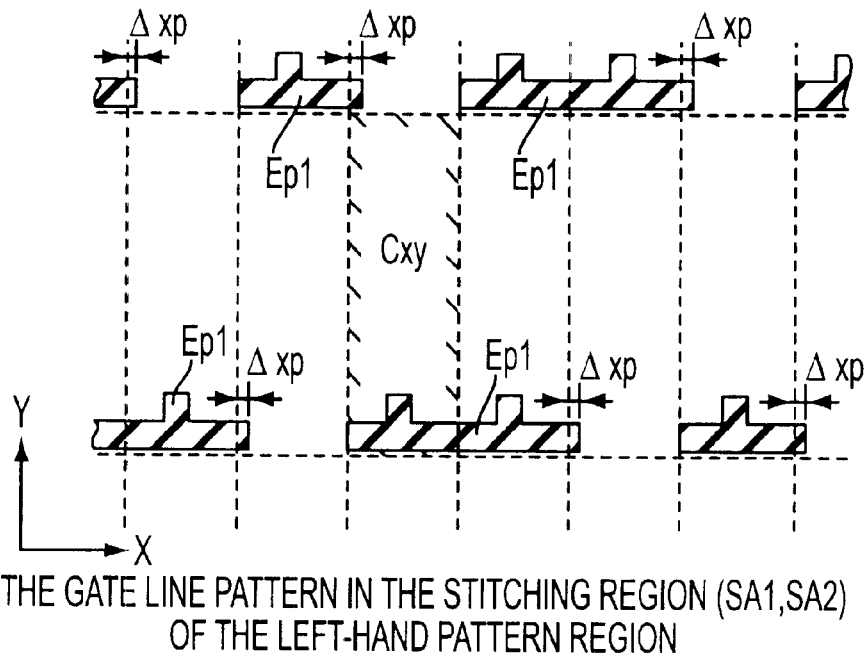
FIGS. 9A and B show the pattern arrangement and configuration in the left and right stitch regions on a mask in order to form a gate wiring layer of a liquid crystal display device according to an embodiment of the present invention.

An example of pattern shaping of the pixel portion formed within the respective stitch regions SA1, SA2 of the four mask substrates M1–M4 shown in FIGS. 7A–D will be described with reference to FIGS. 9–12. FIGS. 9(A), (B) are partial enlarged diagrams of the gate arrangement pattern within stitch regions SA1, SA2 formed in mask M1. The rectangular regions partitioned by broken lines show the display portion divided by the number of pixel cell units (corresponding to the respective Pxr, Pxg, Pxb of the previous FIG. 4A). One specific pixel cell unit within the whole display picture surface will be taken as Cxy. This cell Cxy is at the same coordinates in all the mask substrates M1–M4, and is a mutually superimposed cell in a stitch region (SA1 or SA2) belonging to the left pattern region and in a stitch region (SA1 or SA2) belonging to the right pattern region.

Gate wiring patterns formed within stitch regions (circles BR1, BR2 of FIGS. 2D and E) of the left pattern region (PA, PAL of FIG. 2A) that becomes the left side with respect to the stitch portions JA, JB, JC, JD on the plate shown in FIG. 2B, are granularized by cell units as shown in FIG. 9(A), and the respective division pattern element Ep1 is formed on the mask M1 according to the division/distribution method described for FIG. 8. The right counterpart, which is blank, becomes a unit cell. The right terminal portion of the respective division pattern element Ep1 extends by Δxp into the adjacent neighboring cell unit. This width Δxp is determined so as to become about few $\mu$m on the plate. When the right pattern region is stitch exposed as shown in FIG. 9(B), the exposed division pattern element Ep1 within the cell unit has become blank, and the image of the division pattern element Ep1 of the already exposed plate, are exposed with an overlap of Δxp.

Figure 9B:
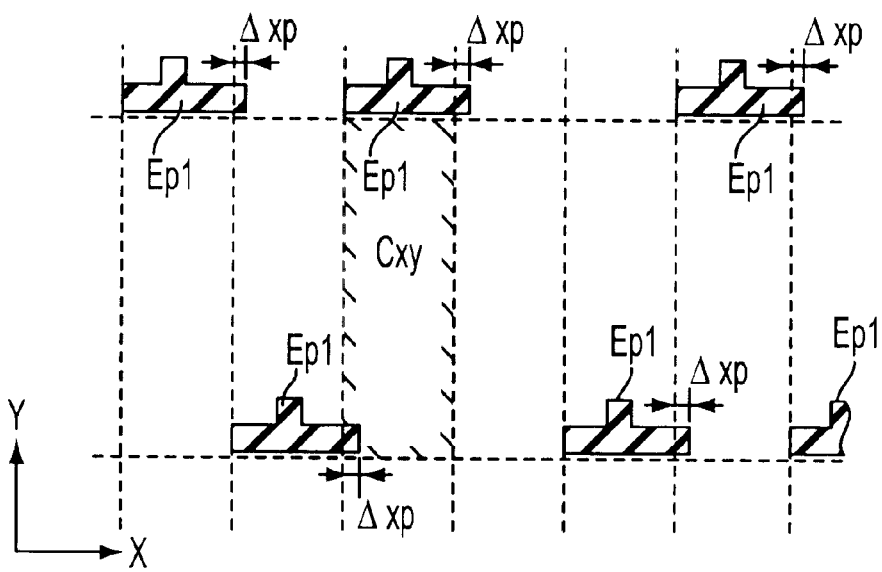

On the other hand, the gate wiring pattern formed within the stitch region (circles BL1, BL2 in FIGS. 2C and F) of the right pattern region (PA, PAR in FIG. 2A) with respect to the stitch portions JA, JB, JC, JD on the plate shown in FIG. 2B, are granularized by cell units as shown in FIG. 9(B), and according to the division/distribution process described in FIG. 8. The respective division pattern element Ep1 is formed on the mask M1. The right end portion of the respective division pattern Ep1, similarly to the case of FIG. 9(A), is projected by Δxp within the adjacent right neighboring cell unit.

As can be seen from the above FIGS. 9(A), 9(B), the Ep1 division pattern counterparts of pixel portions formed within respective stitch regions of left and right pattern regions, are positioned mutually complementarily, and in a random stepping-stone intermitting relationship. Accordingly, when the respective stitch region of FIGS. 9(A), 9(B) are overlap-exposed on a plate, positionally combined with a pixel cell unit Cxy counterpart, all the division pattern elements Ep1 are connected running parallel in a horizontal scan line (X direction), and a continuous gate wiring pattern is formed.

Furthermore, in the shown embodiment, regardless of belonging to either the left or right pattern region with respect to the stitch portion, by causing the right end of the division pattern element Ep1 to project by Δxp in the X direction, stitching is performed by overlap exposure so that the advantage is obtained that the design or inspection of a near infinite number of division pattern elements Ep1 formed within these stitch regions SA1, SA2 can be in common.

According to another embodiment of the present invention, if this commonality can be sacrificed, a division pattern element Ep1 could be formed within a stitch region of the left pattern region with an X direction dimension wholly the same as a cell unit, and a division pattern element Ep1 formed within a stitch region of the right pattern region with the right end and left end may projecting by Δxp. Other variants are also possible.

Within the pattern for use in a-Si layer is formed in the mask M2, the division pattern element Ep2 arranged in the pixel portion within the respective stitch regions SA1, SA2 of the left and right pattern regions, is an isolated rectangular shape (for example, 20 μm square) as shown in FIG. 10. Division pattern elements Ep2 are disposed in such a position as to conform on the projecting portion in the Y direction within the division pattern element Ep1 of the gate wiring pattern of the former layer shown in FIG. 9.

Figure 10A:
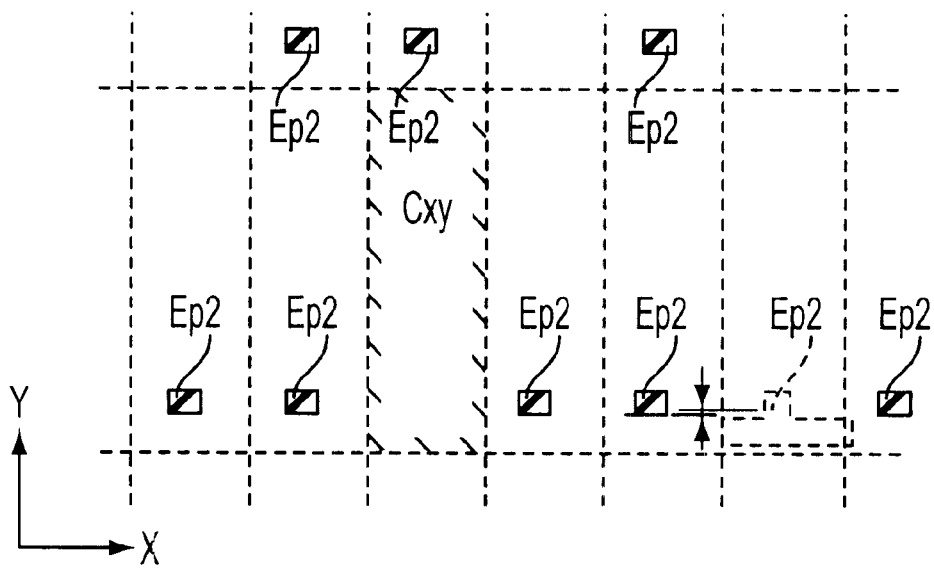
FIGS. 10A and B show the pattern arrangement and configuration in the left and right stitch regions on a mask in order to form the amorphous silicon layer of a liquid crystal display device.

The a-Si pattern formed within the stitch region (circles BR1, BR2 in FIGS. 2D and E) of the left pattern region (PA, PAL in FIG. 2A) consisting of the left side with respect to the stitch portions JA, JB, JC, JD on the plate as shown in FIG. 2B, is miniaturized in cell units as shown in FIG. 10(A), formed on the mask M2 as the division pattern element Ep2 according to the division/distribution method described in FIG. 8.

Figure 10B:
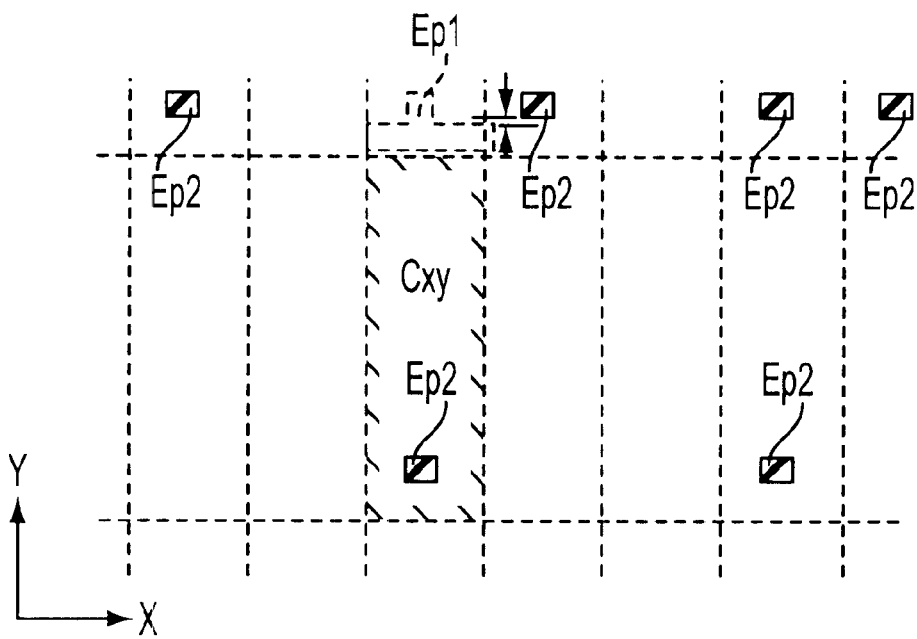

The a-Si pattern formed within the stitch region (circles BL1, BL2 in FIGS. 2C and F) of the right pattern region (PA, PAR in FIG. 2A) consisting of the right side with respect to the stitch portions JA, JB, JC, JD on the plate, is miniaturized in cell units as shown in FIG. 10(B), formed on the mask M2 as the division pattern element Ep2 according to the division/distribution method described in FIG. 8.

As will be clear from the above FIGS. 10(A) and 10(B), the division pattern element Ep2 counterparts of pattern element portions formed within respective stitch regions of the right and left pattern regions, and are in mutually complimentary arrangement in a random stepping-stone interfitting relationship. Accordingly, the respective stitch regions of FIGS. 10(A) and (B) are overlap exposed onto a plate so that the cell unit Cxy counterparts positionally combine, and a pattern of a-Si layer is formed by the division pattern element Ep2 in all the cell units within the stitch region.

The random arrangement within the stitch regions of the division pattern element Ep2 shown in FIGS. 10(A) and (B) pattern is designed so as to differ from the random arrangement state within the region of the division pattern element Ep1 corresponding to the gate wiring pattern shown in the FIGS. 9(A), (B). By thus causing the arrangement to randomize the division pattern elements to mutually differ in the four mask substrates M1–M4, the random dispersal of pixels having luminosity differences within the stitch regions JA, JB, JC, JD makes the stitch inconspicuous.

Figure 11A:
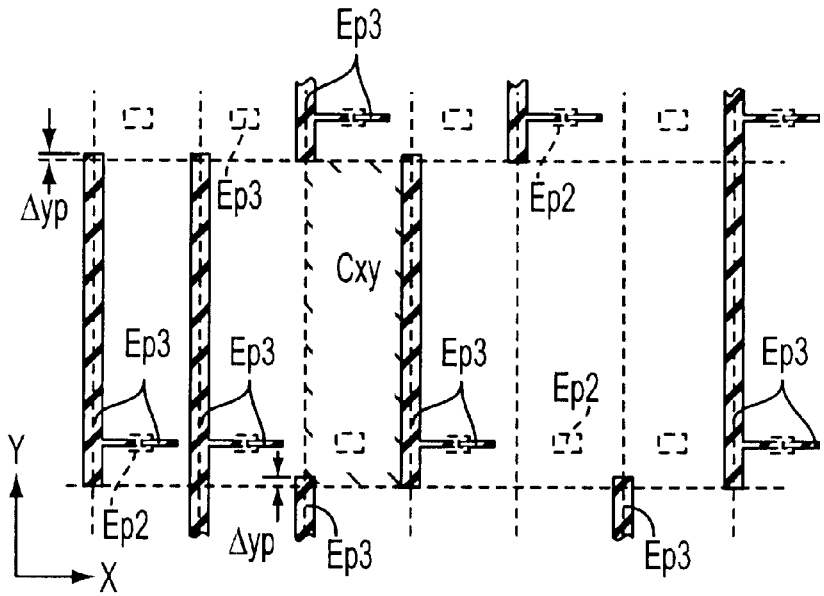
FIGS. 11A and B show the pattern arrangement and configuration in the left and right stitch regions on a mask in order to form a source/drain wiring layer of a liquid crystal display device.

Furthermore, within the pattern for use in drain/source wiring is formed in the mask M3, the division pattern element Ep3 is arranged in the pixel portion of the respective stitch regions SA1, SA2 of the left pattern region and right pattern region, is formed as shown in FIG. 11, arranging according to the division/distribution method described for FIG. 8. The drain wiring portions extending in the Y direction, drain electrode portions extending in the X direction from these drain wiring portions, and source electrode portions, were divided by the number of cell units. The drain/source wiring pattern formed within the stitch region (circles BR1, BR2 in FIGS. 2D and E) of the left pattern region (PA, PAL in FIG. 2A) consisting of the left side with respect to the stitch portions JA, JB, JC, JD on the plate as shown in FIG. 2B, is miniaturized in cell units as shown in FIG. 11(A), formed on the mask M3 as the division pattern element Ep3 according to the division/distribution method described in FIG. 8. The drain electrode portions and source electrode portions within the respective division pattern element Ep3 are patterned so as to conform to the predetermined positional relationship with the division pattern element Ep2 for use in the a-Si layer is formed in the previous layer shown in FIG. 10. In addition, the upper end portion of the drain wiring portion of the respective division pattern element Ep3 is an upper adjacent cell unit which is blank, is formed so as to project by Δyp within the upper adjacent cell unit.

Figure 11B:
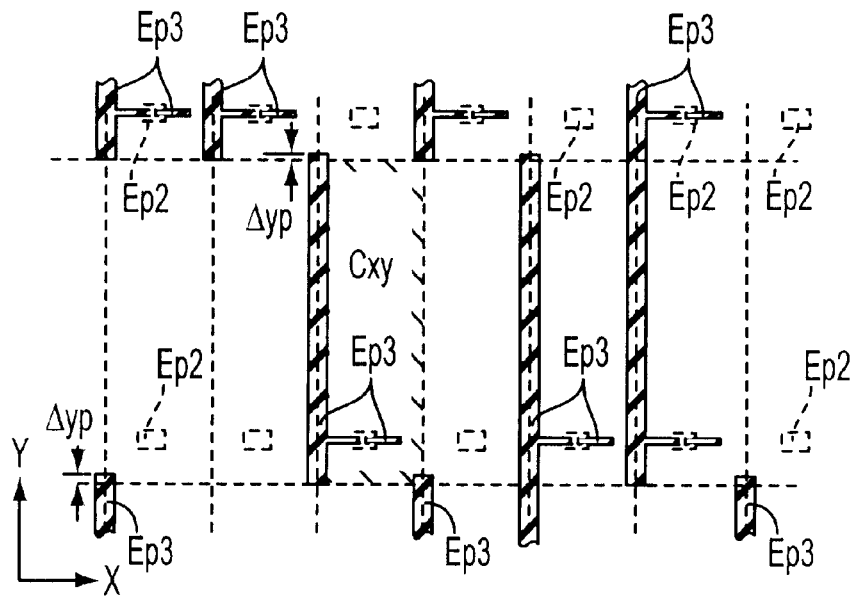

This width Δyp is determined to be a few μm on the plate, and when stitch exposing the right pattern region as shown in FIG. 11(B), the division pattern element Ep3 exposed within a darkened cell unit and the image of the division pattern element Ep3 already exposed on the plate are overlap exposed by a width Δyp.

Moreover, the drain/source wiring pattern formed within the stitch region (see circles BL1, BL2 in FIGS. 2C and F) of the right pattern region (PA, PAR in FIG. 2A) consisting of the right side with respect to the stitch portions JA, JB, JC, JD on the plate, is miniaturized in cell units as shown in FIG. 11(B), formed on the mask M3 as the division pattern element Ep3 according to the division/distribution method described in FIG. 8. The upper end portion of the respective division pattern element Ep3 projects by Δyp within the upper adjacent cell unit.

As will be clear from the above FIGS. 11(A), (B), the division pattern element Ep3 counterparts of pattern element portions formed within respective stitch regions of the right and left pattern regions, are in mutually complementary arrangement, and in random stepping-stone intermitting relationship. When the respective stitch regions of FIGS. 11(A), (B) are overlap-exposed onto a plate so that the cell unit Cxy counterparts positionally combine, a completely joined drain wiring portion is formed by the division pattern element Ep3 in all the cell units in the Y direction along a perpendicular scan line, and a continued drain wiring pattern is formed.

Lastly, as shown in FIG. 12, within the pattern used for cells (ITO film) formed in the mask M4, the division pattern element Ep4 arranged in the pixel portion within the respective stitch regions SA1, SA2 of the left pattern region and right pattern region, is an isolated rectangular shape (for example, 90×270 μm) disposed in such a positional relationship as to overlap the drain electrode portion (STP in FIG. 4) of the division pattern element Ep3 of the drain/source wiring pattern formed in a former layer shown in FIG. 11 and the right lower projecting portion (Tpp in FIG. 4) of the cell pattern.

Figure 12A:
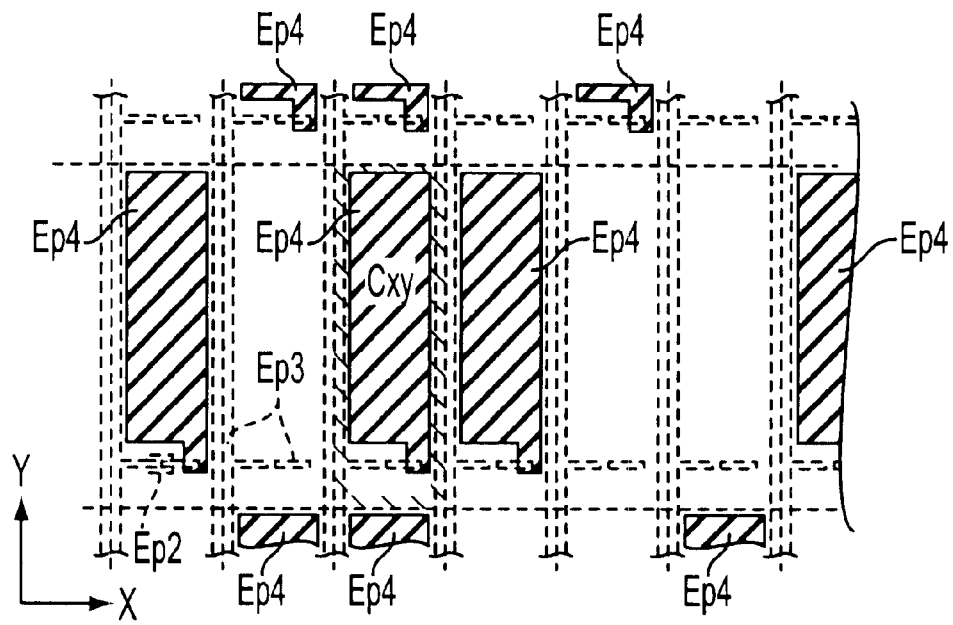
FIGS. 12A and B show the pattern arrangement and configuration in the left and right stitch regions on a mask in order to form a display cell (ITO film) layer of a liquid crystal display device.

The cell layer pattern formed within the stitch region (circles BR1, BR2 in FIGS. 2D and E) of the left pattern region (PA, PAL in FIG. 2A) consisting of the left side with respect to the stitch portions JA, JB, JC, JD on the plate as shown in FIG. 2B, is miniaturized in cell units as shown in FIG. 12(A), formed on the mask M4 as the division pattern element Ep4 according to the division/distribution method described in FIG. 8.

Figure 12B:
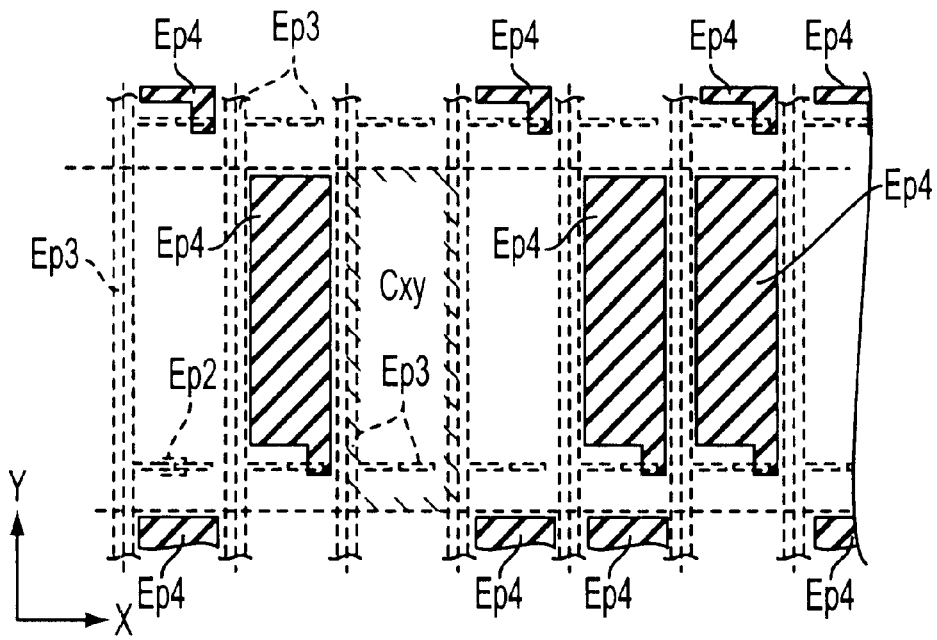

The cell layer pattern formed within the stitch region (circles BL1, BL2 in FIGS. 2C and F) of the right pattern region (PA, PAR in FIG. 2A) with respect to the stitch portions JA, JB, JC, JD on the plate, is miniaturized in cell units as shown in FIG. 12(B), formed on the mask M4 as the division pattern element Ep4 according to the division/distribution method described in FIG. 8.

As will be clear from the above FIGS. 12(A), (B), the division pattern element Ep4 counterparts of pattern element portions formed within respective stitch regions of the right and left pattern regions, are in mutually complementary arrangement and in random stepping-stone intermitting relationship. Accordingly, when the respective stitch regions of FIGS. 12(A), (B) are overlap exposed onto a plate so that the cell unit Cxy counterparts positionally combine, a cell (ITO film) pattern is formed by the division pattern element Ep4 in all the cell units within the stitch region.

The random arrangement in the stitch pattern of the division pattern element Ep4 corresponding to the cell pattern shown in FIGS. 12(A), (B) has a pattern designed to differ from the random arrangement in the respective division pattern elements Ep1, Ep2, Ep3 shown in FIGS. 9–11. However, the dispersion within the residual alignment error of the cells themselves is not a critical factor in causing the contrast error in the stitch regions JA, JB, JC, JD.

For this dispersion, the arrangement state of the division pattern element Ep4 of each cell unit within the stitch regions SA1, SA2 formed in the mask M4 may be the same arrangement state as any of the mask substrates M1–M3. In particular, because alignment of the drain wiring pattern and the source wiring pattern formed in former layers is important, the arrangement of the division pattern element Ep4 may be the same arrangement as the division/distribution of the division pattern element Ep3 formed in the mask M3.

The arrangement method of the division pattern elements of each cell unit formed within the stitch regions SA1, SA2 within the respective pattern regions PA, PAL, PAR is as previously described in FIG. 8. There is, to some extent, an experimental and experiential trend between the contrast difference arising left and right of the respective stitch regions JA–JD on the plate P and the stitch width (the X direction width of SA1, SA2) on the display picture surface. This trend depends on the size, cell unit dimensions, process and the like of the manufactured display device.

Figure 13:
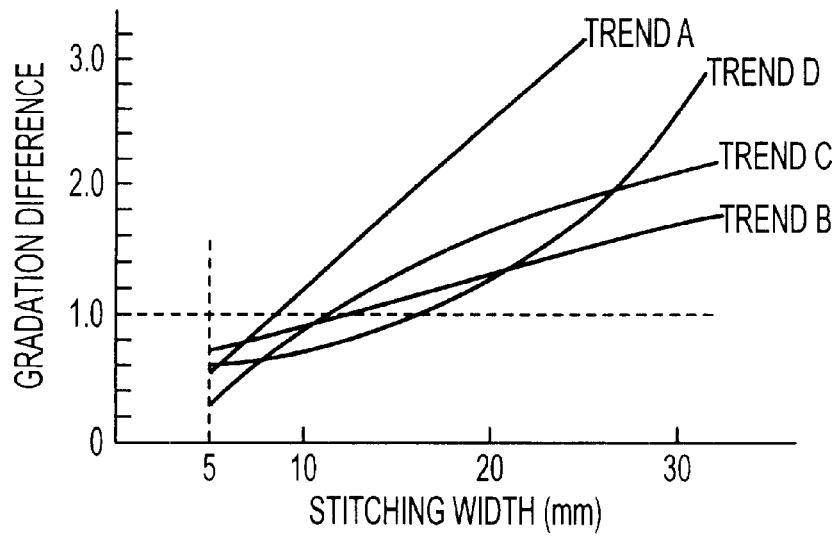
FIG. 13 is a graph illustrating the contrast difference (gradation difference) of a display portion to be joined and the stitch width of a stitch portion formed by a random stepping-stone pattern division/distribution method according to an embodiment of the present invention.

FIG. 13 is a graph showing typical trends. The ordinate represents the gradation difference corresponding to the contrast difference between display picture surfaces located to left and right of a stitch portion, and the abscissa represents the stitch width. The gradation difference corresponds to a resolving power of the drive voltage, with the luminosity arising when the same drive voltage is applied to the same color of two neighboring pixels to be compared.

Normally, the gradation of pixels is determined by the drive voltage applied to the drain electrode of the transistor in order to regulate the transparency of the respective cell, and the recognition of a luminosity difference by the naked eye changes according to the hue, pattern, density, individual human differences and the like of the displayed image. The graph in FIG. 13 shows the typical gradation difference from left to right of a rectilinear joint arising when the whole picture surface of a display device with two display regions rectilinearly joined is lit with a single color, and the stitch width (or pixel number) necessary in order to smoothly grade this gradation difference. Generally, if the gradation difference between picture surfaces stitched left and right is small, the stitch width is small, but if the gradation difference is large, the stitch width also becomes large.

However, this trend changes, as in the trends A, B, C, D in FIG. 13, according to the size of the manufactured display device or the manufacturing process, due to the illumination device used. Trends A, B have rather straight line characteristics. Trend A, for example, is for a picture surface 40 inches in size, the smaller trend B is for a smaller picture surface size. Trend C is the case of an increase of gradation difference due to an exponential increase in stitch width, with the difference being that at about 2 gradations, a stitch width of about 30 mm becomes necessary. Trend D has a characteristic the reverse of trend C, and is a case where even when the gradation difference increases the stitch width does not increase to this degree, where at a difference of 1 gradation the stitch width becomes about 15 mm, and at a difference of 3 gradations the stitch width becomes about 30 mm.

Various trends are obtained in this manner, but the relationship of the gradation difference and the stitch width, according to these trends is not unlimited in its application, and there is an upper limit to some extent. For example, in the case where there is a contrast difference of 5 or more gradations in the stitch portion such as when stitch width large, even using the stitch method as in the shown embodiment (FIGS. 1 or 2), because the contrast difference in the stitch portion change is visible in a belt form, it may be necessary to reconsider each of various parameters of the exposure device settings (exposure amount correlation, alignment correlation, focus correlation, and the like) or practical application in order to optimize the manufacturing process.

The basic manufacturing method of a display portion of a display device has been described hereinabove, but is only one way in which the stitch pattern form and arrangement on the mask substrates M1–M4 formed within stitch portions JA–JD on a plate P and the arrangement is not limited to a complementary random stepping-stone interfitting relationship. For instance, as shown in FIG. 14, the division pattern elements within respective stitch regions SA1, SA2 could form up to some position in the X direction (stitch direction) a complementary interfitting relationship randomly disposed along a horizontal scan line.

Figure 14:
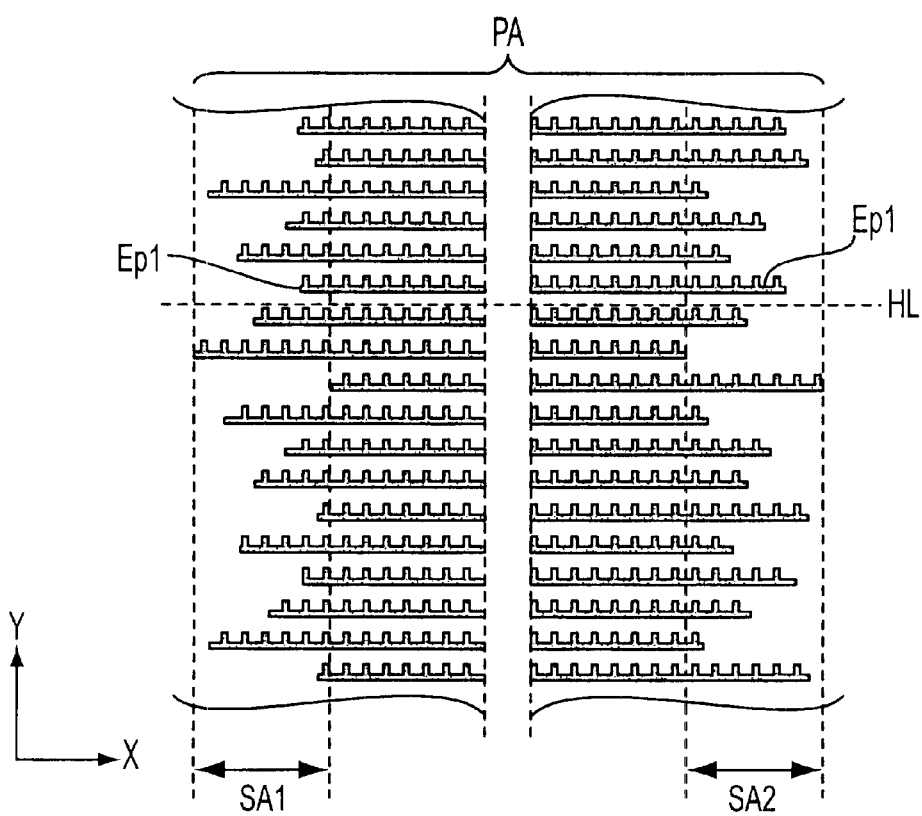
FIG. 14 is a diagram illustrating a method of pattern division in a stitch region formed on a mask according to another embodiment of the present invention.

FIG. 14 shows the formation state within stitch regions SA1, SA2 of a gate wiring pattern formed on a mask M1, a division pattern element Ep1 within a left stitch region SA1 and a division pattern element Ep1 within a right stitch region SA2 are arranged along the same horizontal scan line HL, and are joined as one gate wiring pattern by overlap exposure of the stitch regions SA1, SA2. Thus, the joint is made in randomly interfitting form.

The left end of the division pattern element Ep1 formed within the left stitch region SA1, and the right end of the division pattern element Ep1 formed within the right stitch region SA1 are designed in a pattern so as to be superimposed by Δxp in the X direction as described for FIG. 9. Furthermore, the left end of the left division pattern element Ep1 and the right end of the right division pattern element Ep1 fix cell positions joined in the X-direction on a plate such that they are random in each respective horizontal scan line. Such a random arrangement and form, like that described for FIG. 7 above, are preferably different between the masks M1–M4. However, where the stitch width is small, there is no need to cause particular differences, and they may be the same.

Moreover, in the stitch regions SA1, SA2 on some masks, when forming division pattern elements according to the method of the above FIG. 8, in stitch regions SA1, SA2 on particular masks the division pattern elements may be formed by a method as in FIG. 14.

In addition, the width in the X direction of the stitch regions SA1, SA2, as described for FIGS. 8 and 14, is the same in all the masks M1–M4. However, this stitch width may itself be changed in each mask. As described above, because the main factor in changing the contrast difference is the variation existing in the electrical characteristics of the transistors disposed in each cell of the respective pixel, in the mask used in forming the critical transistor forming layer, the width of the stitch regions SA1, SA2 may be set wide (for example, about 120%–150% times the standard value), with the width of the other stitch regions SA1, SA2 in the masks used for the exposure of the non-critical layers being the standard.

Figure 15:
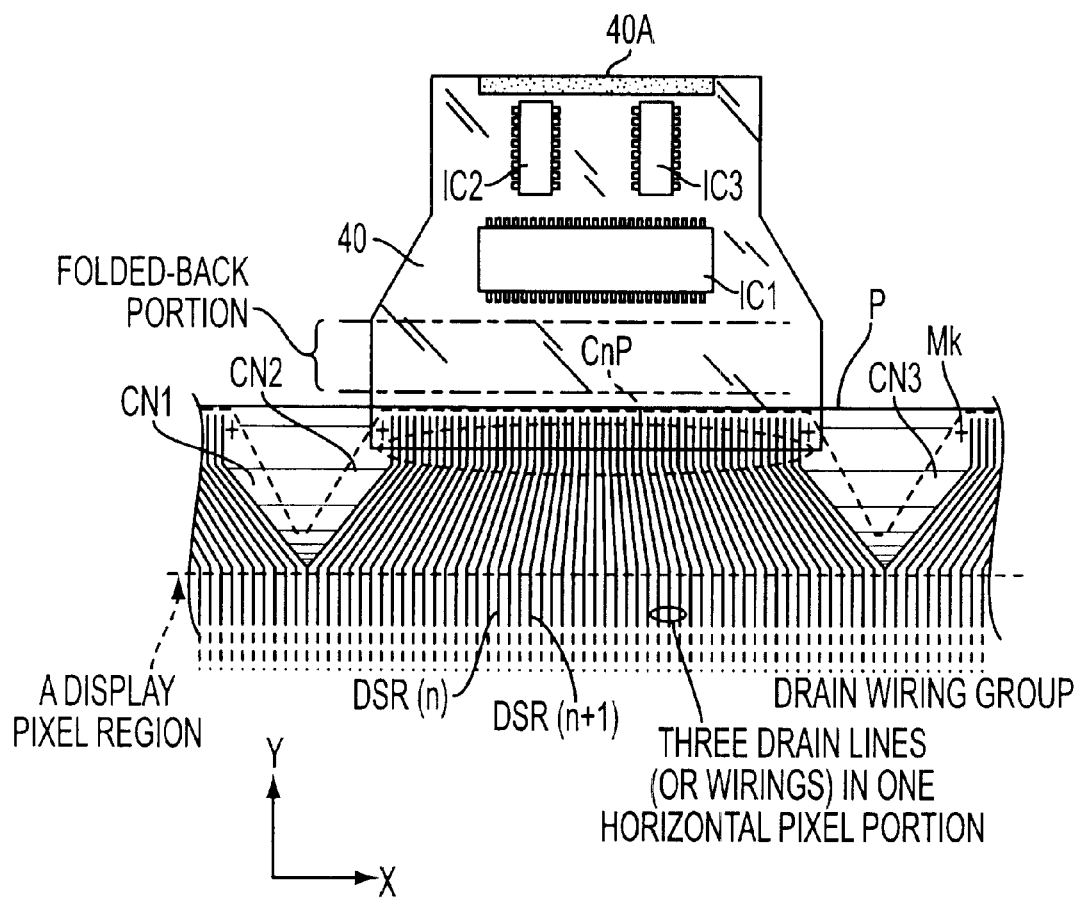
FIG. 15 is a diagram illustrating the construction of a tab sheet substrate connected to a terminal unit of a plate periphery of a liquid crystal display device according to an embodiment of the present invention.

Also, in the terminal pattern portions CN1, CN2, CN3 formed in the upper and lower peripheral portions of the collective pattern region PA, as shown in FIGS. 1 and 2, the drain wiring groups DSR(n), DSG(n), DSB(n) connecting in common to the drain of each transistor of all cells lined up in a row in the vertical direction as described for FIG. 6, are formed as in FIG. 15.

FIG. 15 shows the construction and arrangement of a tab 40 connected to the respective terminal portions CN1, CN2, CN3. For example, the 384 drain wiring groups of 128 pixels (128×3 pixel cell portions) are arranged in the peripheral edge portion of the plate P as connection terminal units CnP having a pitch in the X direction slightly narrower than the pitch of the cell units. The respective connection terminal units CnP of these terminal units CN1, CN2, CN3, are normally formed together with the drain/source wiring pattern formed on the mask M3 shown in FIG. 11, and are made of the same metal material as the drain/source wiring layer on the plate P.

As shown in FIG. 15, for example, numerous wires are formed, applied in a pattern to respective wires within the connection terminal units CnP toward the plate P, on the front end back surface of the flexible tab 40 connected to the terminal unit CN2. These wires are connected to drain circuit IC1 as an on-board drain drive circuit in wiring tab 40. This drain circuit IC1, for example, controls the drain voltage of transistors corresponding to respective cells of the 128 pixels in the horizontal direction.

Moreover, because a folded-back portion of the tab 40 is disposed in the peripheral edge neighborhood of the plate P, by putting the tab 40 at this folded-back portion and folding back toward the back surface of the plate P, the width of the picture frame can be narrowed when making a product of the display device. In particular, this is an advantage for a portable computer and the like. Furthermore, circuits other than the drive circuit IC1, such as integrated circuits IC2, IC3 and the like, can be mounted on tab 40. A connector unit 40A can then be formed at the rear end of the tab 40 to connect the picture signals of the main circuit board.

The tabs 40 as above are mounted to the respective terminal portions CN1, CN2, CN3 by an assembly process after the series of lithographic processes has been completed, but at this time it is necessary to accurately positionally combine the tab 40 and the terminal unit. The marks Mk for use in positional assembly are formed in the end portion of the tab 40 and the peripheral edge portion of the plate P.

Such a mounting method using the tab 40 is suitable for a portable computer or mobile device in which the picture frame cannot be thick. However, because the thickness of the picture frame for the display and the like of a stationary type large television or a desktop computer need not be minimized, the drive circuit IC1 can be soldered to the region of the terminal units CN1, CN2, CN3 shown in FIG. 15. In addition, if using a low temperature polysilicon process, the IC elements suitable for the drive circuit IC1 can also be directly formed lithographically. However, in such a case, the wiring pattern configuration formed within the respective terminal units CN1–CN3 will obviously be different from that shown in FIG. 15.

In a case such as the terminal unit CnP as in FIG. 15 in which the wiring patterns are formed in the respective terminal units CN1–CN3, the left and right separated terminal units CN1, CN3 of the collective pattern region PA become stitch exposed on the plate P. Because of this, as regards the terminal unit on the mask also, in order to form a complementary interfitting relationship, it is possible to apply the division/distribution method of the pattern.

Figure 16:
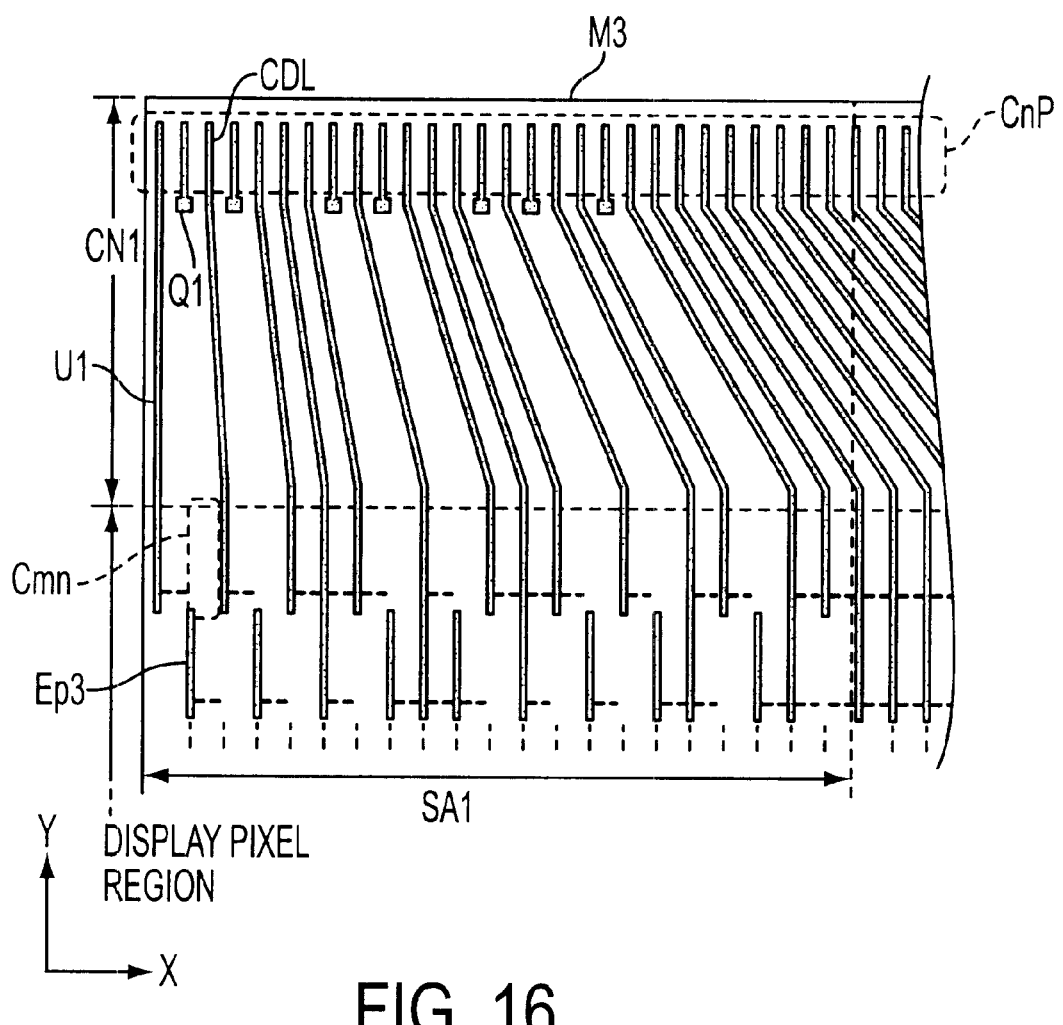
FIG. 16 is a diagram showing a wiring structure within a terminal unit positioned on the right side of a stitch region within a stitch exposed mask pattern according to an embodiment of the present invention.

However, because errors in the patterning of the tab 40 are unrelated to the display picture surface, the division/distribution method of the cell units as described in FIG. 8 is unnecessary. Consequently, this portion of the embodiment is described with reference to FIGS. 16 and 17. FIG. 16 is a partial enlarged diagram of the form of pattern formed in the terminal unit CN1 within the left stitch region SA1 of the collective pattern region PA on the mask M3 for use in drain/source wiring pattern formation.

As FIG. 16 shows the pixel array of the horizontal scan line in the uppermost position of the display region within the stitch region SA1. The division pattern element Ep3 for use in the drain/source wiring with a cell unit is formed with a random arrangement according to the division/distribution method as described for FIG. 11. Then, within the uppermost pixel array, the division pattern of each cell forming the division pattern element Ep3 extends the continuing wiring pattern portion U1 from this division pattern element Ep3 to the wiring end portion CDL corresponding to the interior of the connection portion CnP. If the division pattern element Ep3 of each cell unit is not formed but is a blank, the wiring end portion CDL is formed, together with a junction portion Q1 corresponding to this cell.

Figure 17:
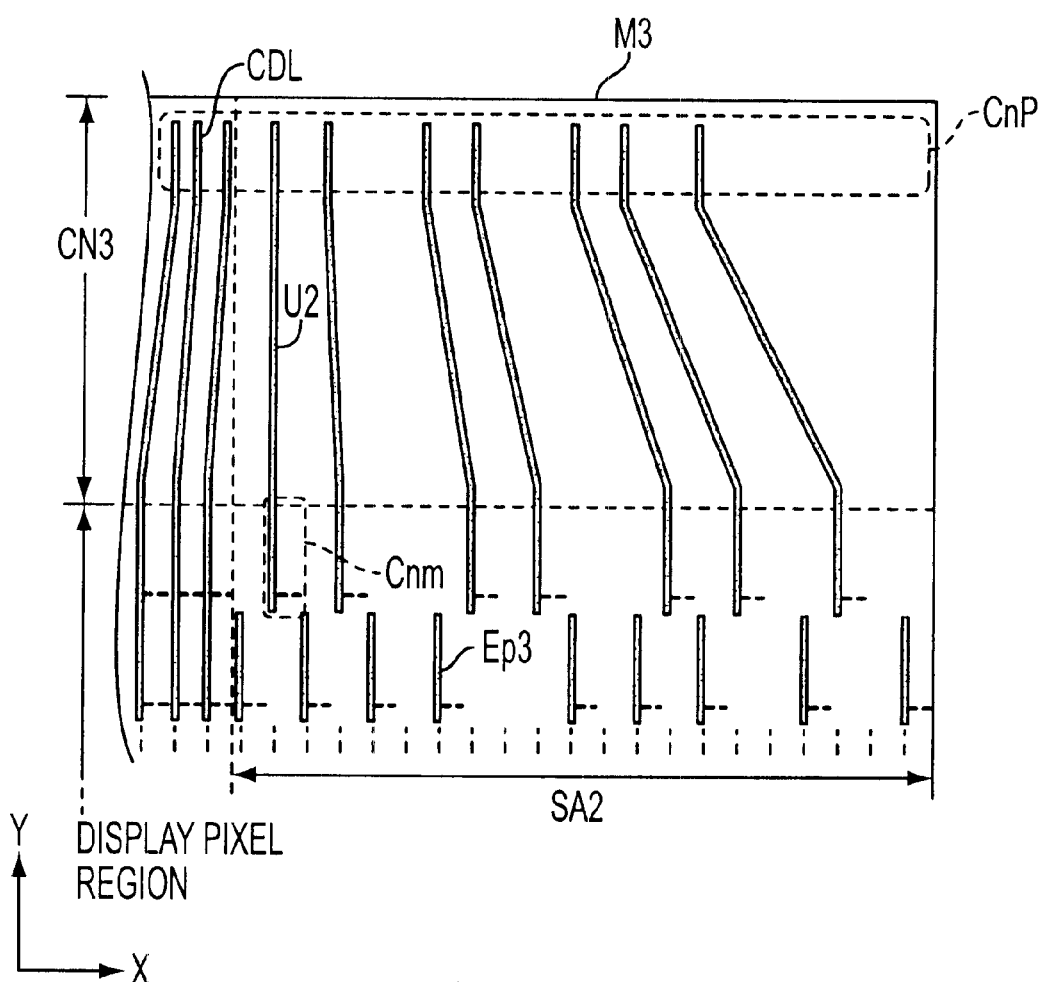
FIG. 17 is a diagram showing a wiring structure within a terminal unit positioned on the left side of a stitch region within a stitch exposed mask pattern according to an embodiment of the present invention.

In the stitch region SA1 in FIG. 16, and within the stitch region SA2 of the terminal unit CN3 on the right side of the superimposed collective pattern region PA shown in FIG. 17, the patterns are formed in complementary intermitting relationship. Accordingly, when they are an accurately superimposed onto the plate of the specific cell unit Cmn counterpart in FIGS. 16 and 17, the uppermost end of the wiring portion U2 extends from the division pattern element Ep3 in the direction of the connection terminal unit CnP to be joined. Wiring portion U2 is superimposed in the Y direction by Δyp (about 1–5 μm), with the latent image of the joint portion Q1 of the wiring terminal portion CDL in FIG. 16 already transferred to the plate.

Generally, in order to become serviceable in common with respect to the respective terminal units CN1–CN3, one tab 40 is responsible for the drain wiring (384 lines) of 128 pixels in the horizontal direction. When the number of pixels in the horizontal direction is 1024 terminal units similar to the terminal unit CN2 are formed in eight places in the X direction, and eight tabs 40 are necessary.

Because of this, as shown in FIG. 2A, terminal units CN1 and CN3 are arranged on both the upper and lower sides of the collective pattern region PA, and are the same as the pattern wiring or shape within the terminal unit CN2 formed between them in the collective pattern region PA. However, there is a limit to the total pixel number in the horizontal direction within the display region or the drain wiring number within which the drive circuit IC1 can operate, and thus it is not always possible for all the terminal units to have the same configuration or arrangement.

In this case, the number of drain wiring lines are contained in a specific terminal unit that does not have the same configuration or arrangement as other terminal units. These specific terminal units have a reduced number of drain wiring lines for which a tab 40 is responsible, with the tabs 40 also being used in common. Moreover, while the collective pattern region PA shown in FIGS. 1 or 2 have terminal units CN1–CN3 are formed in the top and bottom, they may also be in the top or the bottom only. However, in this case, the pitch of the wiring pattern in the terminal unit CnP becomes too fine. Because of this, by arranging the terminal units CN1–CN3 in the top and bottom of the collective pattern region PA, for each pixel (three RGB cells), a drain portion pattern group may be alternately distributed to a top side of terminal units CN1–CN3 and to a lower side of the terminal units CN1–CN3.

Figure 18:
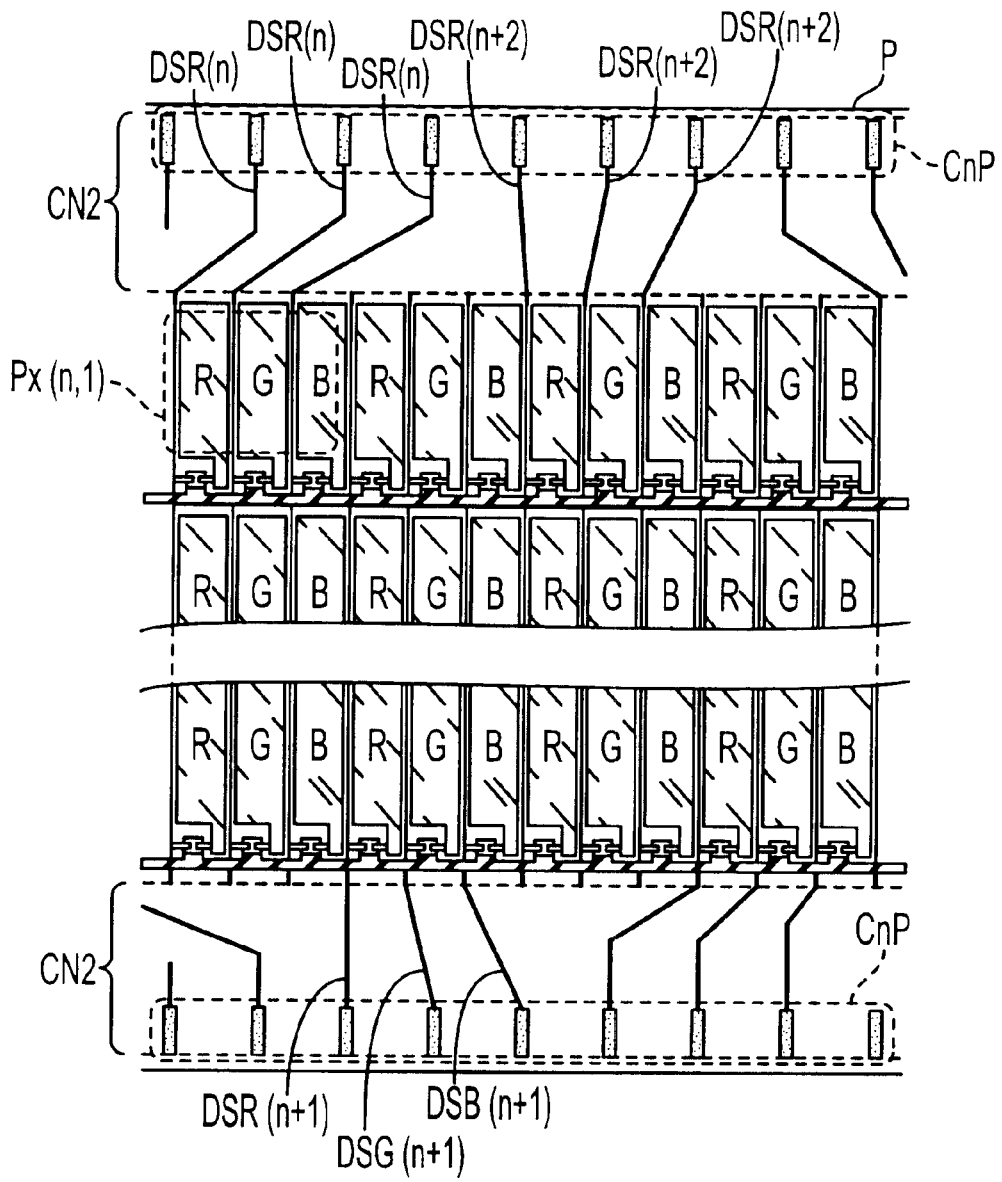
FIG. 18 is a diagram showing a wiring structure when arranging drain wiring, distributed in respective terminal units of the upper side and lower side of a display region, to drive the respective display pixel cell units of a liquid crystal display device according an embodiment of the present invention.

FIG. 18 is a diagram showing an example of a distribution case in which the drain wiring pattern of adjoining pixel counterparts is distributed to an upper side terminal portion CN2 and a lower side terminal portion CN2. For pixel Px(n, 1) in the uppermost display surface, and drain wiring DSR(n), DSG(n), DSB(n) driving the pixel Px(n, 1) including respective cells (three RGB cells) are connected to connection terminal unit CnP formed within the upper side terminal unit CN2. The drain wiring DSR(n+1), DSG(n+1), GSB(n+1) which drives each cell (three RGB cells) of the pixel in the vertical direction which includes the pixel Px(n+1,n), located to the right of the pixel Px(n, 1), is connected to the connection terminal unit CnP formed within the lower terminal unit CN2. By distributing the drain wiring connection to each pixel in the horizontal direction to the upper side terminal portion CN2 and the lower side terminal unit CN2, the pitch of the wiring pattern within the connection terminal CnP can be relieved.

When making a wall hanging television of 40 inches or more, or a large display device, the collective pattern region PA is scan exposed multiple times in the horizontal scan line direction and is not at all limited to what can be in common on the mask substrate. This is because it is limited by both the largest dimension of mask which can be loaded into the exposure device, and by the largest dimension relating to the non-scan direction (X direction) of the projection visual field of the exposure device. Thus, the pattern PA may be formed and placed on two or more mask substrates divided into 2–3 kinds.

Figure 19:
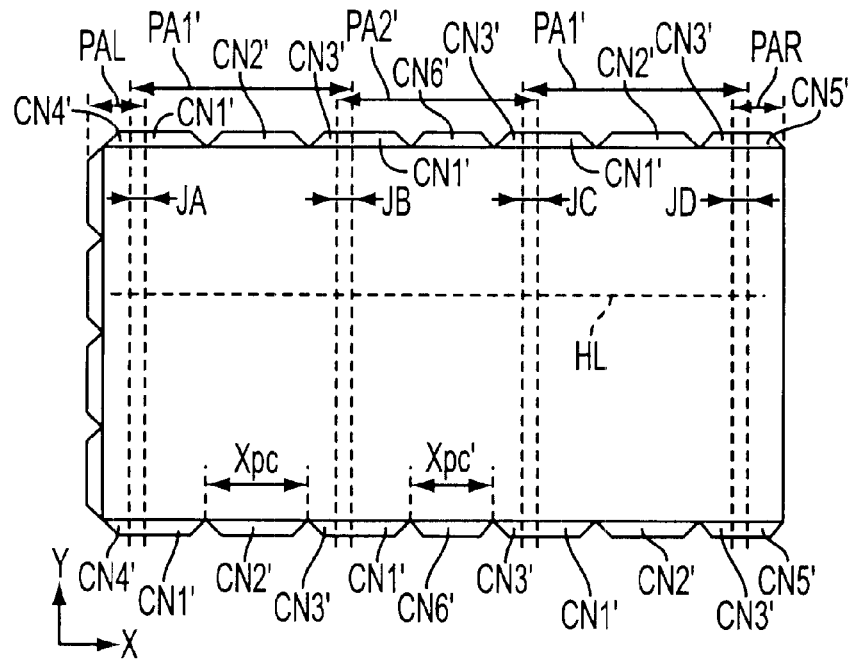
FIG. 19 is a diagram illustrating the configuration of a specific stitch exposure in order to manufacture a display device for use in a large type display device according to an embodiment of the present invention.

FIG. 19 shows an example of mask pattern division method while forming this kind of large display on a plate. In order to form a picture surface of wide transverse length, five mask patterns are stitch exposed in the horizontal direction (X direction). A left side pattern region PAL, a right side pattern region PAR, and three collective pattern regions PA1', PA2', PA1'. The plate P is stitch exposed five times in the Y direction, and between each scan exposure, the plate P is stepped in the X direction.

If the pattern structures formed within the respective collective pattern regions PA1', PA2' have the same configuration and arrangement and X direction dimension as in FIG. 2B, it is possible to form on the mask a left side pattern region PAL, a right pattern region PAR, and one collective pattern region PA as in FIG. 2A. Otherwise, as shown in FIG. 19, it is possible that the two collective pattern regions PA1', PA2' are not in common.

For example, there is also the case in which the X direction dimension of the collective pattern region PA2' is a division smaller than the collective pattern region PA1'.

In this case, the three pattern regions, the right side pattern region PAL, the left side pattern region PAR, and the collective pattern region PA2', are formed on a first mask, and the collective pattern region PA1' is formed on a second mask. During the exposure of a layer, these two masks are interchanged and stitch exposed.

Where the same pattern is repeatedly scan exposed, the size of the terminal unit is reduced in the X direction an integral number of times (connecting terminal unit CnP is responsible for drain wiring of the maximum number of widths Xpc). In FIG. 19, consisting of the division of each of two terminal blocks, when the terminal unit CN1' and the terminal unit CN3' are combined in the X direction, at completely the same size as the terminal unit CN2', the same structure of wiring pattern is formed.

However, because the terminal units CN2' and CN6' are not initially divided, it is not necessary for the divided terminal units CN1', CN3' to agree in shape or length. Thus, there may be independent X direction dimensions (corresponding to the number of drain wiring) of the terminal units CN2', CN6', and different X direction dimensions of a terminal group formed by the junction of terminal group CN1' and terminal group CN3'. In the case of FIG. 19, the relationship of the width Xpc of the terminal group CN2' and the width Xpc' of the terminal group CN6' is that Xpc>Xpc'.

Furthermore, it is necessary for the divided terminal units CN1', CN3' to be mutually geometrically congruent in some stitch portion. There is no limitation on the shape of the terminal units of the terminal units for use in the gate wiring accessory to the left side pattern region PAL (or the right side pattern region PAR), and the pitch may also differ. In FIG. 19, terminal groups which have to have the same configuration and wiring pattern structure are shown with the same reference symbol, but the terminal unit CN4' included in the left pattern region PAL may be joined to the terminal unit CN1', and does not always have to have the same shape and dimension as the terminal unit CN3'. Similarly, the terminal unit CN5' and the terminal unit CN3' may be included in the right side pattern region PAR, but it is not necessary for the terminal unit CN1' to have the same shape or dimension.

Moreover, it is possible to insert, on the mask, in the terminal unit vicinity, or within the terminal portion pattern region, an alignment mark used in the exposure device. A mark provided for use in a later processes, or a TEG (test element group) pattern. These marks or patterns can be disposed in optional positions of the display pixel region.

When manufacturing a plate mask as in FIG. 19, the mask stage of the exposure device cannot always move a large distance in the non-scanning direction (X direction) with respect to the projection system PL. For instance, if that the pattern arrangement is two collective pattern regions PA1' and one collective pattern region PA2' having a common dimension, to be transferred by three stitch exposures, it is necessary for the total dimension of the X direction dimension of one collective pattern region PA2' and the X direction dimension of two terminal unit pattern regions PAL, PAR to be smaller than the X direction maximum range of the projection visual field of the exposure device (ExS of FIGS. 1, 2 or the total of IA1–IA5 of FIGS. 21, 22).

As an example, a description will be given with reference to FIG. 20 for the manufacture of a display panel for an HDTV, where the display region has a horizontal pixel number of 1920 and a vertical pixel number of 1080. When the transverse direction is 1920 pixels in the case of color stripe arrangement of the three RGB colors, it is necessary for the terminal unit to be responsible for a total of 1920×3=5760 drain wires. The tab and connection wiring of the terminal are normally divided by output terminal number units of the driver IC (corresponding to circuit IC1 of FIG. 15).

Figure 20:
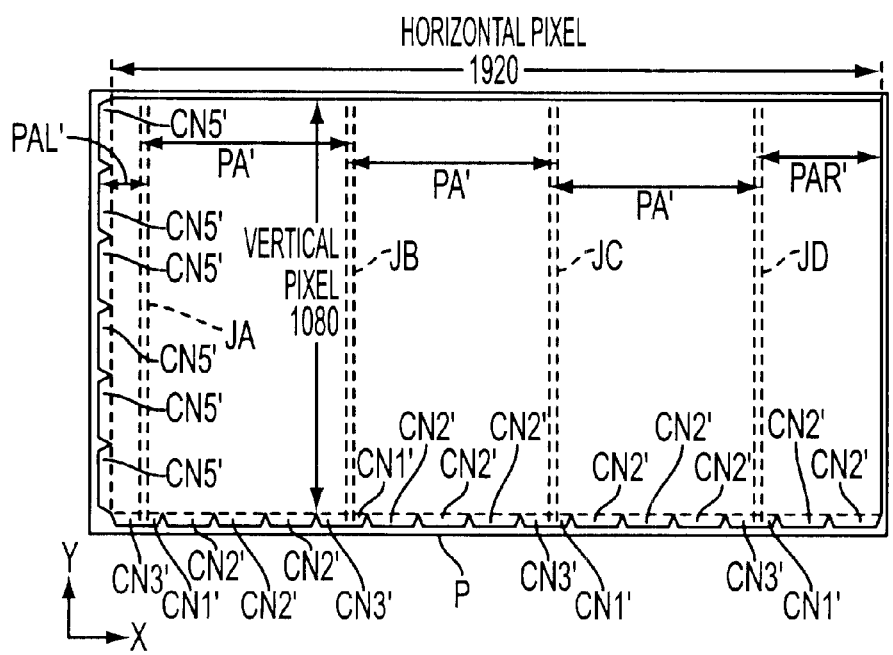
FIG. 20 is a diagram illustrating the configuration of stitch exposure in order to manufacture a display device for use in HDTV with a 40 inch width and a 16:9 aspect ratio according to an embodiment of the present invention.

FIG. 19 shows the case (refer to FIG. 18) in which drain wiring projects on both top and bottom of the display picture surface, but in FIG. 20 the drain terminal wiring projects only in the terminal units CN1'–CN4' on the lower side of the display picture surface. In addition, gate terminal wiring in terminal units CN5' are only on the left side of the display picture surface.

Moreover, because a driver IC of this kind having 384 (128 pixels×3) outputs is used, exactly 15 (5760÷384) driver ICs can be responsible for all the drain wiring of the horizontal scan line direction.

In the case of a display with a 40 inch display picture surface and an aspect ratio of 16:9, when the pitch in the horizontal direction of cell units in one pixel is 154 $\mu$m, the length of the display picture surface becomes 887.04 (5760×0.154) mm, resulting in a 40.07 inch display. Because of this, where the length dimension is equally divided by 15 driver ICs, the X direction pitch (or width) of one terminal unit CN2' is 59.136 mm.

As in FIG. 19, in the case of three repeated scanning exposures of a display portion in a sequence of PA1', PA2', PA3', except for a portion (for example, CN4' and CN5') of the terminal units of left and right ends, fourteen terminal units are a maximum. However, this number is not divisible by three, and twelve terminal units are set as the closest number divisible by three. Because these transfer onto the plate in three scan exposures, the pattern region PA' is a display portion in one scan exposure time, and in addition a terminal portion can be simultaneously transferred. The terminal portion is divided on the mask, but is combined on the Plate P as shown in FIG. 20 by stitch exposing the terminal unit CN2' and the pair of terminal portions CN1' and CN3' which have the same shape and dimensions. Three terminal units CN2' are not divided on the mask substrate, making a total of four terminal units after exposure.

In FIG. 20, because the respective X direction dimension of respective pattern regions PA' are the same, the X direction dimension of one pattern element PA' is the X direction dimension of four terminal units CN2' in a row, and becomes 4×59.136=236.544 mm. The remainder is three portions in units of terminal unit CN2', in FIG. 20. These three portions are arranged divided into the left pattern region PAL' and is exposed to form one terminal unit CN3', and into the right pattern region PAR' and is exposed to form one terminal unit CN3', and two terminal units CN2'.

Here also, if the width of the joint (SA1, SA2) is assumed to be zero, because the pair of terminal portion CN1' and terminal unit CN3' have. After stitch exposure the same dimension as the terminal unit CN2', the X direction dimension of each of the terminal units CN1', CN3' is taken as Xn1, Xn3, the result is Xn1+Xn3=59.136 mm. Moreover, when the X direction width a of the terminal portion CN5' used for gate wiring arranged in the left side of the display picture surface is 10 mm, assuming the width of the joint to be zero, the X direction dimension of the left side pattern region PAL' becomes (Xn3+$\alpha$), and the X direction dimension of the right side pattern region PAR' becomes Xn1+118.272 mm.

Accordingly, where there is no gate wiring terminal unit on the right side of the display picture surface, assuming the joint width to be zero, the total X direction dimension of pattern drawing region necessary on one mask becomes PA' (236.544 mm)+PAL' (Xn3+$\alpha$mm)+PAR'(Xn1+118.27 mm)=423.952 mm. Moreover, where a terminal unit for use in gate wiring is disposed on the right side, because the X direction dimension of the right pattern region PAR' is increased by $\alpha$ mm, the total X direction dimension of the pattern drawing region on the mask becomes 433.952 mm.

If these X direction dimensions 423.952 mm or 433.952 mm are less than the width of the total X direction exposure visual field (ExS of FIG. 1A, or IA1–IA5 of FIG. 22) of the exposure device used by placing and changing the mask on the mask stage in the non-scanning direction (X direction), scanning exposure is possible without the necessity of causing a large movement of the mask stage itself in the non-scanning direction. However, for the abovementioned dimensions, 423.952 mm or 433.95 mm with the dimension of the joint being assumed to be zero, taking account of the width and number of stitch portions of the stitch regions SA1, SA2, can be a larger dimension than this.

If abovementioned X direction dimensions 423.952 mm or 433.952 mm are larger than the width of the total exposure visual field in which projection is possible for one scan exposure of the exposure device an increasing the number of scan exposure times of the pattern region PA' of the display portion are necessary. For example, in FIG. 20, the pattern region PA' is formed in three scan exposures. When made so as to form the display region in four scan exposures, the width of the pattern region PA' is 177.408 mm, to cover the X direction dimension of three parts of the terminal unit CN2'.

Because of this, what is necessary on one mask is a pattern region of total X direction dimension consisting of PA' (177.408 mm)+PAL' (Xn3+$\alpha$mm)+PAR' (Xn1+118.272 mm)=364.816 mm, or PA'+PAL'+PAR' (Xn1+118.272+$\alpha$mm)=374.816 mm.

However, actually the stitch regions SA1, SA2 formed left and right of the pattern region PA', the stitch region SA1 formed at the right end of the pattern region PAL', and the stitch region SA2 formed in the left end side pattern region PAR', a total of four stitch regions are necessary. The X direction dimension of these are added to the abovementioned dimension 364.816 mm or 374.816 mm.

In this manner according to an embodiment of the present invention, based on the X direction pitch (width) of the terminal unit CN2', the number of terminal blocks, and the X direction dimension of the total exposure visual field (ExS, IA1–IA5) of the exposure device, by changing the number of scanning exposures, the X direction width of a pattern region projected onto the mask substrate is changed.

The structure of the wiring pattern of the terminal units as above is made roughly similar to the terminal regions CN4, CN5, CN6 formed on both sides on the plate P shown in FIG. 2. A predetermined number (for example, 256) of gate wiring GL(m−1), GL(m), GL(m+1), shown in FIG. 6, each arranged within the terminal units CN4, CN5, CN6, forms a wiring pattern group as a tab and its connecting terminal unit (CnP).

Figure 21:
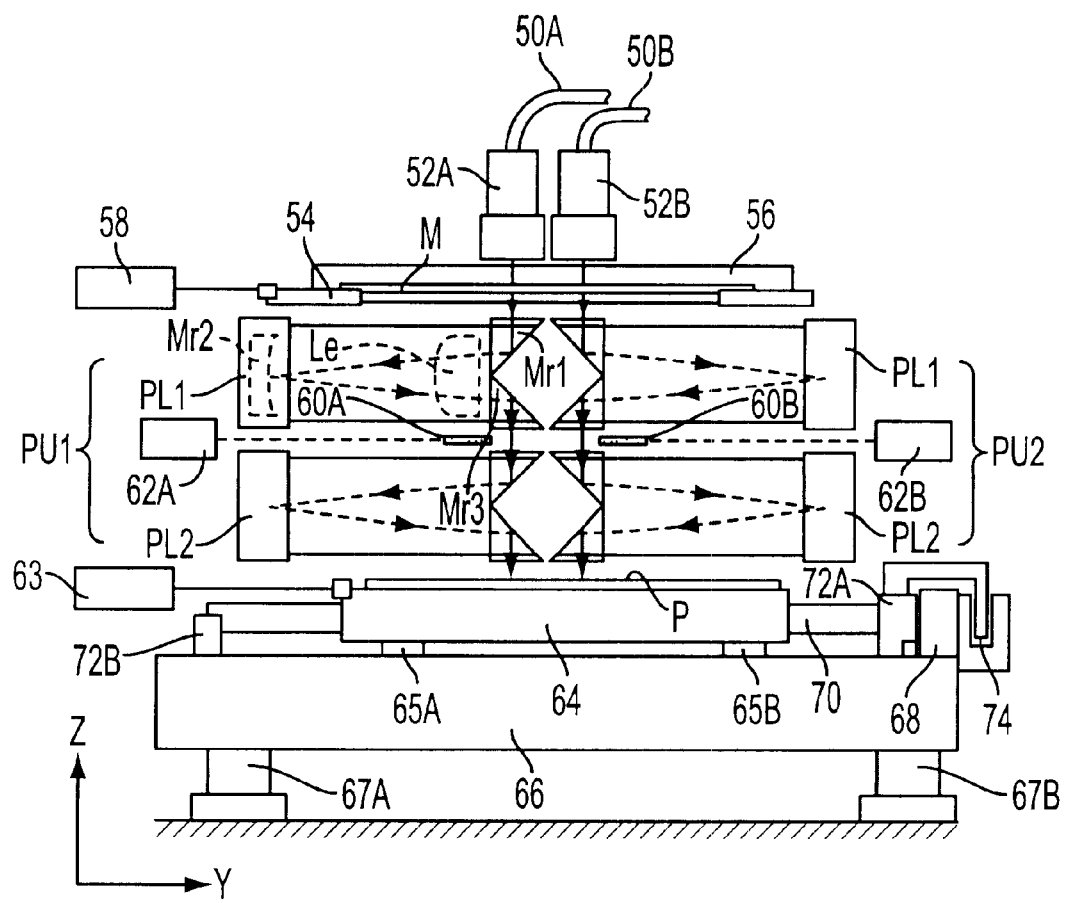
FIG. 21 schematically illustrates another scanning type projection exposure device according to an embodiment of the present invention.
Figure 22:
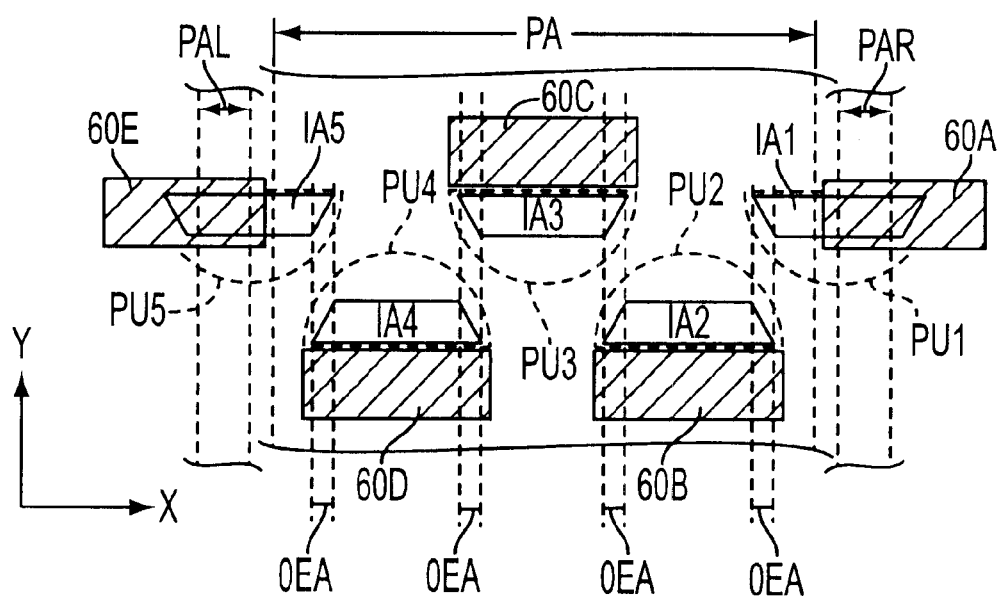
FIG. 22 is a diagram illustrating the planar arrangement of the exposure visual field in the exposure device of FIG. 21.

An exposure device according to another embodiment of the present invention is described with reference to FIGS. 21 and 22. FIG. 21 is a diagram showing the schematic arrangement of an exposure device, and FIG. 22 is a diagram showing a typical relationship of the mask pattern and the projection visual field in the exposure device of FIG. 21. The exposure device of FIG. 21, for example as disclosed in U.S. Pat. No. 5,729,331 the disclosure of which is incorporated herein by reference, has projection optical unit PU projecting an equal magnification erect image from a pair of Dyson type of equal magnification imaging systems PL1, PL2 optically connected in tandem. The projection optical unit PU has a combined projection system of five sets of individual projection optical units, PU1–PU5 with respective projection visual fields arranged in a zigzag fashion in the XY plane. However, only PU1 and PU2 are shown for simplicity.

In FIG. 21, the illuminating light from a light source used passes through 5 sets of filters 50A, 50B disposed in respective projection optical system units PU1, PU2 and is incident on the illuminating optical systems 52A, 52B. The illuminating light from the respective optical systems 52A, 52B irradiates a mask M. The mask M moves with a large stroke in the Y direction, which is the scanning direction, and in addition in the X direction at right angles to this, and is chucked and supported on a mask stage 54, which is finely movable in θ rotation. The mask stage 54 is driven by motors 56 which are linear or voice coil type motors and the like. The movement position or speed of the mask stage 54 in scanning illumination time are controlled according to the coordinate position or amount of yaw of the mask stage 54, successively measured by an interferometer 58.

The imaging light beam from the pattern of a portion of the mask M illuminated by the illumination optical systems 52A, 52B via respective projection optical systems PU1–PU5, is projected to illuminate the plate P. The plate P is attached and supported on the two-dimensionally moving plate stage 64, which is supported by plural air bearing pads 65A, 65B as a guide surface on a surface plate 66.

The movement in the Y direction of this two-dimensionally moving plate stage 64 is performed by linear motors disposed in movable guide member 70. The movement in the X direction of the two-dimensionally moving plate stage 64 is performed by a linear motor 74 disposed in the surface plate 66. The force due to the linear motor 74 moving one-dimensionally along a linear guide member 68 arranged to extend in the X direction on the surface plate 66 is transmitted by a movable guide member 70 via an air bearing pad 72A.

Moreover, the weight of the movable guide member 70 is supported on the surface plate 66 by means of an air bearing pad 72B other than the air bearing pad 72A. An air bearing is disposed facing a guide surface formed in the interior of the two-dimensionally moving stage 64 in the side surface (surface parallel to the YX plane) of the movable guide member 70. The weight of the two-dimensionally movable stage 64 is supported on the surface plate 66 by air bearing pads 65A, 65B. Furthermore, in the lower surface of the surface plate 66, active anti-vibration mounts 67A, 67B are disposed in order to reduce the inclination or floor vibration of the whole device.

Because the structure of such a two-dimensionally movable stage 64 is disclosed, for example, in JP-A-S61-209831 or JP-A-H8-233964 (U.S. Pat. No. 5,623,853 which is incorporated herein by reference), a detailed description further to the above will be omitted here. The device of FIG. 21 is similar to the exposure device shown in FIG. 3, and is equipped with a control system to cause simultaneous movement in the Y direction of the mask stage 54 and the two-dimensional moving stage 64 at the time of scanning exposure. This control system servo controls the respective linear motors so as to obtain optimum synchronous accuracy, based on measurement information from an interferometer 63, which measures the coordinate position or fine rotation error amount (yaw) of the two-dimensional moving stage 64, and the measurement information from an interferometer 58 which measures the coordinate position or fine rotation error amount (yaw) of the mask stage 54.

The structure of each of the projection optical system units PU1–PU5 is basically the same and will be described based upon a representative projection optical system PU1. The initial Dyson equal magnification imaging system PL1 has a prism mirror Mr1, lens system Le, concave mirror Mr2, and prism mirror Mr3. An intermediate image surface, conjugate with the pattern surface of the mask M, is formed in the exit side of the prism mirror M3. Because the intermediate image created at this intermediate imaging surface has an equal magnification but is an inverted image (reversed image), an erect image with equal magnification is imaged on the plate P by relay imaging with the equal magnification imaging system PL2 of a second stage of the same construction.

Furthermore, in the position of the intermediate imaging surfaces of each of the projection optical system units PU1–PU5, movable blinds 60A, 60B independently vary the size and configuration of the projection visual field of the respective units PU1–PU5. The adjustment of each variable blind 60A, 60B is controlled by drive units 62A, 62B. The variable blinds 60A; 60B have the same function as the variable blind member AP shown in FIG. 3.

As shown in FIG. 22, each of the projection visual fields IA1–IA5 of the projection optical system units PU1–PU5 has a trapezoid shape, the oblique side portion regions OEA of respective trapezoids are arranged in a zigzag form so as to overlap. As regards the relationship of the constitution and projection visual field of such projection optical system units PU1–PU5, there are disclosures in, for example, U.S. Pat. Nos. 5,625,436 and 5,602,620 the disclosures of which are incorporated herein by reference. A mechanism or method is also shown in these patents in order to perform adjustment of magnification differences between each projection visual field IA1–IA5, for the adjustment of fine position errors of images, and the adjustment of fine rotational errors and the like. The exposure device of FIG. 21 of the shown embodiment also has this kind of adjustment mechanism.

In the exposure device of the shown embodiment of the present invention, a movable blind 60A, 60B, 60C, 60D, 60E is disposed in each respective visual field IA1–IA5. The rectangular movable blind 60A is disposed with respect to the right-most projection visual field IA1, and the rectangular movable blind 60E is disposed with respect to the left-most projection visual field IA5 to largely move in the X direction. The rectangular movable blinds 60B, 60C, 60D are disposed with respect to the other projection visual fields IA2, IA3, IA4 and largely move in the Y direction.

When scan exposing the collective pattern region PA on the mask M as in FIG. 22, a portion of the visual field IA1 is screened by the movable blind 60A, a portion of the visual field IA5 is screened by the movable blind 60E to prevent a projection of the pattern region PAR and the pattern region PAL onto plate P. Conversely, when scan exposing the pattern region PAR on the right side of the mask M, a portion of the projection visual fields IA2, IA3, IA4, IA5 is screened by the movable blinds 60B, 60C, 60D, 60E, and the movable blind 60A is adjusted so as to make effective only the amount corresponding to the width of the right pattern region PAR (namely the right side of the projection visual field IA1 in FIG. 22) within the projection visual field IA1. Similarly, when scan exposing the left pattern region PAL on the mask M, the projection visual fields IA1, IA2, IA3, IA4 are screened and the movable blind 60E is adjusted so as to make effective only the amount corresponding to the width of the left side pattern region PAL (namely the left side of the projection visual field IA5 in FIG. 22) within the projection visual field IA5.

When using the exposure device shown in FIG. 22, in comparison with the mirror projection exposure device shown in FIG. 3, because there is no need for a very large concave mirror, and the size of the projection system as a structure can be compact. In addition, because projection exposure can be performed by the projection visual fields IA1–IA5, by juxtaposing plural projection optical system units PU1–PU5, which are made mutually independent, if the plural projection optical system units PU1–PU5 are adjusted so that the manufacturing errors between the projection optical system units PU1–PU5 become small, the distortion of the respective projection optical system units PU1–PU5 becomes uniform. As a result, an advantage is that distortion errors such as to bring about large changes according to the position on the plate are suppressed.

Moreover, because illumination optical systems 52A, 52B, 52C, 52D, 52E are disposed in each of the plural projection optical system units PU1–PU5, there is increased freedom to adjust the illumination intensity or illuminance variation of each individual projection optical system unit PU1–PU5. This is also an advantage since a further fine adjustment of illuminance becomes possible by this means, and management of the exposure amount according to position on the plate becomes relatively simple.

Figure 23:
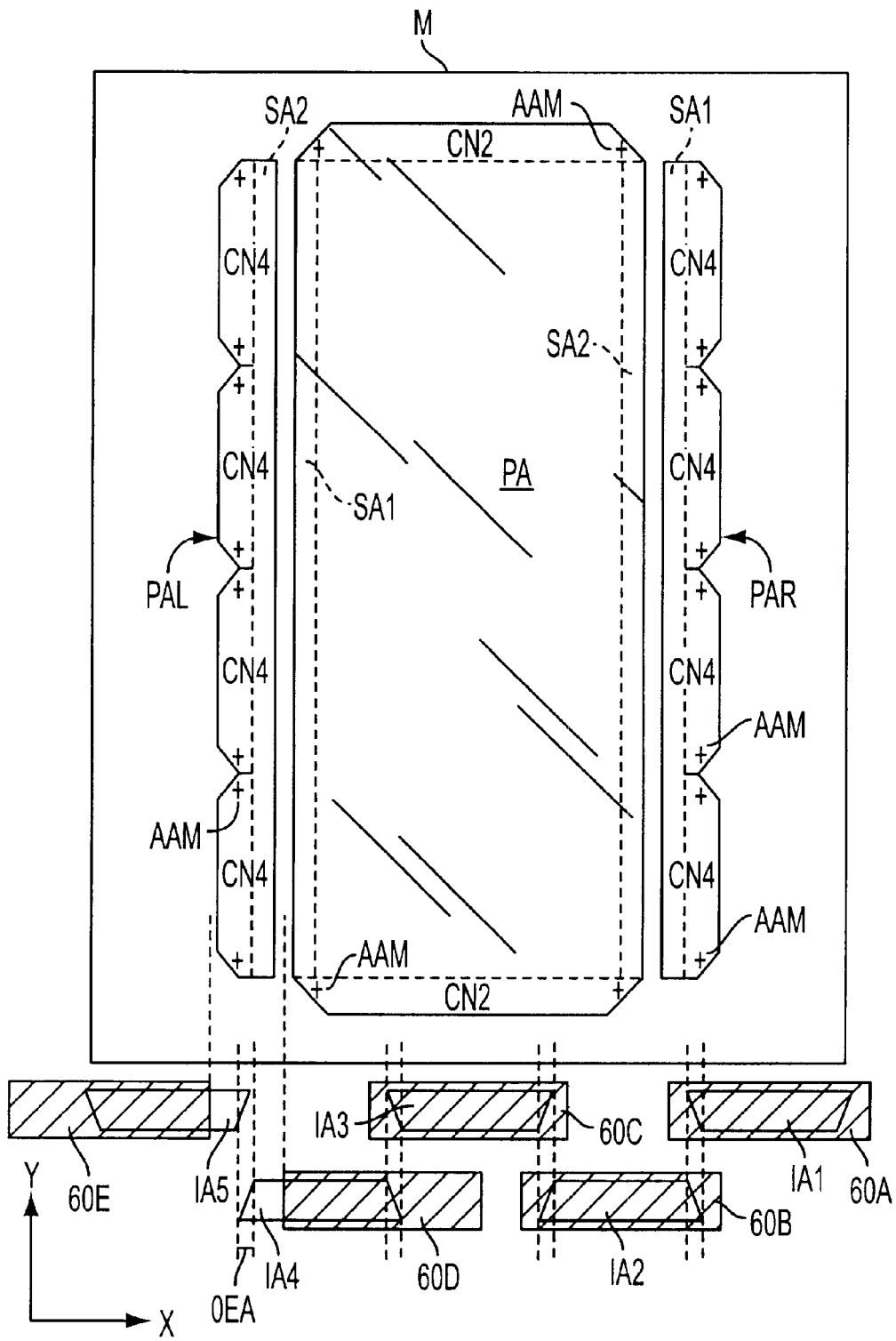
FIG. 23 is a diagram illustrating an example of a pattern arrangement of a mask mounted in the exposure device of FIG. 21.

FIG. 23 shows a modified example the pattern arrangement on the mask M, suitable for use with the exposure device of FIG. 21. As compared with the pattern arrangement shown in FIG. 2, it has the characterizing feature that the pattern formation region on the mask (particularly the dimension of the X direction, which is the non-scanning direction) is smaller. In FIG. 23, the collective pattern region PA on the mask M is equipped with a completed terminal unit CN2 on both sides in the Y direction (scanning exposure direction), the right pattern region PAR and left pattern region PAL are arranged on both sides of the X direction of the collective pattern region PA with a light barrier member of predetermined width arranged to lie between them.

Because the width in the X direction of the collective pattern region PA is as large as possible in the pattern arrangement shown in FIG. 2, the terminal portion that was to be completed was formed divided in the X direction into the terminal units CN1, CN3. However, in the shown embodiment, the width of the collective pattern region PA has been limited so as to make the width in the X direction that of one completed terminal unit CN2 (width of the maximum number of drain wiring accepted on the drain circuit IC1 as in FIG. 15). To do this, the width in the X direction of the collective pattern region PA can be smaller than in the case of FIG. 2, which reduces the pattern inspection time for the mask.

However, when exposing a mask having the collective pattern region PA as in FIG. 23 as well as using the movable blinds 60A, 60E, 60B, 60D that move in the X direction, the movable blind 60C can also be constructed to also move in the Y direction.

Accordingly, when exposing only the left pattern region PAL on the mask M, by adjusting the position in the X direction of the movable blinds 60D, 60E as in FIG. 23, partially limits the projection visual fields IA4, IA5, with the other movable blinds 60A–60C are fully closed. Then, the overlap portion of the oblique side portion regions OEA of the trapezoids of the projection visual fields IA4, IA5 is positioned on the left pattern region PAL.

Furthermore, in a blank portion within the respective terminal unit CN4 formed in the left pattern region PAL, the right pattern region PAR, or a blank portion within the terminal unit CN2 formed in the top and bottom end of the collective pattern region PA on the mask M shown in FIG. 23, various kinds of marks AMM are formed which are used for the alignment with the plate P. Among these marks, for example, a mark AMM is formed in the blank portion within the terminal unit CN4. The mark AMM is detected by a corresponding mark on the plate through the projection optical system units PU1, PU5, which respectively form the projection visual fields IA1 and IA5, is using an alignment microscope of the TTM (through the mask) method.

In the pattern arrangement on the mask M shown in the above FIG. 23, the X direction width of the collective pattern region PA was fixed as the same as the width of the terminal unit CN2, but as previously described for FIG. 19, when the terminal unit CN2 is responsible for 128 pixels (384 drain wiring) in the horizontal scan line direction, the width of the terminal unit CN2 becomes about 60 mm. This effect reduces which of the five projection optical system units PU1–PU5 are used. The reason for this is because the X-direction dimension (top to bottom length of a trapezoid) of the projection visual fields IA1–IA5 of the respective projection optical system units PU1–PU5 can be about 60 mm.

In other words, for the mask as in FIG. 23, all five projection optical system units are not used. The smallest number of projection optical system units, in the extreme case, means that a projection system can be made with one projection optical system unit. Nevertheless this case, as a matter of course, increases the number of scan exposures. For the shown embodiment, there would have to be fifteen stitch exposures for the exposure of a plate corresponding to 40 inches if only one optical system unit is used.

Moreover, if the terminal unit CN2 shown in FIG. 23 could be responsible for 256 pixels in the horizontal scan line direction (i.e., it can use one driver IC having 768 output lines), one tab sheet could be installed connecting two driver ICs of 384 output lines in cascade. This would double the width of a terminal unit CN2 to 120 mm, and the five projection optical system units can be reduced to about two or three, making the projection system compact, while reducing the number of scanning exposure times by half.

Figure 24:
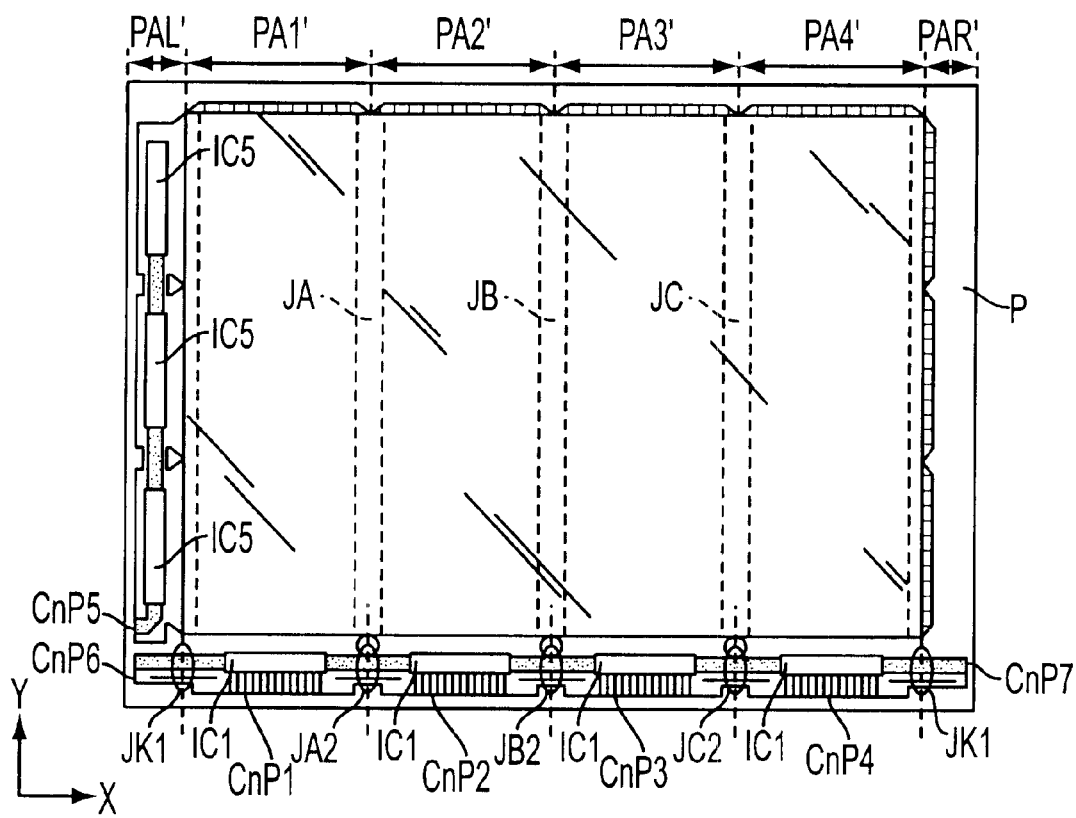
FIG. 24 is a diagram illustrating the stitching method of wiring when integrally forming a driver circuit for use in driving a display pixel in the peripheral portion of a display region according to an embodiment of the present invention.

Next, referring to FIG. 24, the configuration of another display device and its method of manufacture will be briefly described. In the display device on a plate P shown in FIG. 24, each kind of driver IC circuit is lithographically inserted corresponding to terminal unit regions formed in its peripheral regions. Each driver IC circuit are external circuits, connected by the connection wiring units CnP5, CnP6 shown on the lower left portion of FIG. 24. The connection wiring unit CnP7 shown in the lower right portion, and the various connection wiring units CnP1–CnP4 horizontally are arrayed in the lower portion.

Each of the four connection wiring units CnP1–CnP4 is connected to the input of a dedicated driver IC circuit IC1, and the respective output terminals of the driver IC are connected to the drain conductors corresponding to the number of pixels in the horizontal scan direction. Moreover, the three driver IC circuits IC5 for use in gate wiring are arranged on the left side of the display picture surface. The three driver IC circuits IC5 include a decoder unit or a shift register unit, and are connected so as to be responsible for the orderly arrangement of a suitable number of systematically arrayed gate conductors.

Furthermore, the three driver IC circuit IC5 counterparts for use in gate wiring, are connected in or parallel by wiring groups. Included in these wiring groups are common power supply lines, ground lines, clock signal lines and the like. The connection wiring unit CnP5 is connected to external circuits. Similarly, four driver IC circuit IC1 counterparts arranged also in the lower side of the display picture surface using wiring groups (power supply lines, ground lines, clock signal lines and the like) extended in the X direction. The four driver IC circuits IC1 are connected by the wiring groups in cascade or parallel, and are connected to external circuits by connection wiring units CnP6 or CnP7.

In the case of the display device shown in this FIG. 24, the pattern regions formed on one or plural masks respectively correspond to each of left pattern region PAL', right pattern region PAR', and collective pattern regions PA1', PA2', PA3', PA4'. As shown in the embodiment, the four collective pattern regions PA1', PA2', PA3', PA4' are of the same structure, with one collective pattern region PA on the mask, as described for FIGS. 1 or 2, being formed on the plate P by repeated stitch exposure.

Then, the respective wiring groups connecting the driver IC circuit IC1 in the X direction are mutually connected by connecting units JK1, JA2, JB2, JC2 formed together in stitch portions JA, JB, JC, which are similar to the stitch of such wiring patterns outside the display picture surface, shown in FIGS. 1C and E. Since there is no need to account for contrast differences, it is unnecessary to divide the wiring patterns formed within stitch regions into random interfitting pattern elements, and they may be placed just as a simple wiring joint.

Moreover, the collective pattern regions PA1'–PA4' are formed as a common mask pattern PA. For example, a respective front end enveloping curve of the wiring pattern group positioned on the right side of the joint within the connecting portion JA2 is formed accompanying the collective pattern region PA2', and the pattern group positioned on the left side of the joint in the connecting portion JB2 are in mutually complementary relationship (also including simple rectilinear form). Furthermore, the wiring pattern group counterparts positioned left and right of the joint have a patterning superimposed by a few $\mu$m.

If the driver ICs are inserted together in the lithographic process, a low temperature polysilicon treated material is used as the plate. In addition, transistors in the driver IC also including transistors for use in driving pixels, are made by a polysilicon process, which is not an amorphous silicon (a-Si) process.

Next, the method of pattern testing/inspection of the mask and the inspection device according to the present invention is described with reference to FIGS. 25 and 26. The same mask M of FIG. 23 is used as an example to show the pattern inspection for the modes of detecting whether the pattern can be correctly joined, whether the joint has the correct pitch, or the pattern portions are made the same as on the design, and the like.

Figure 25:
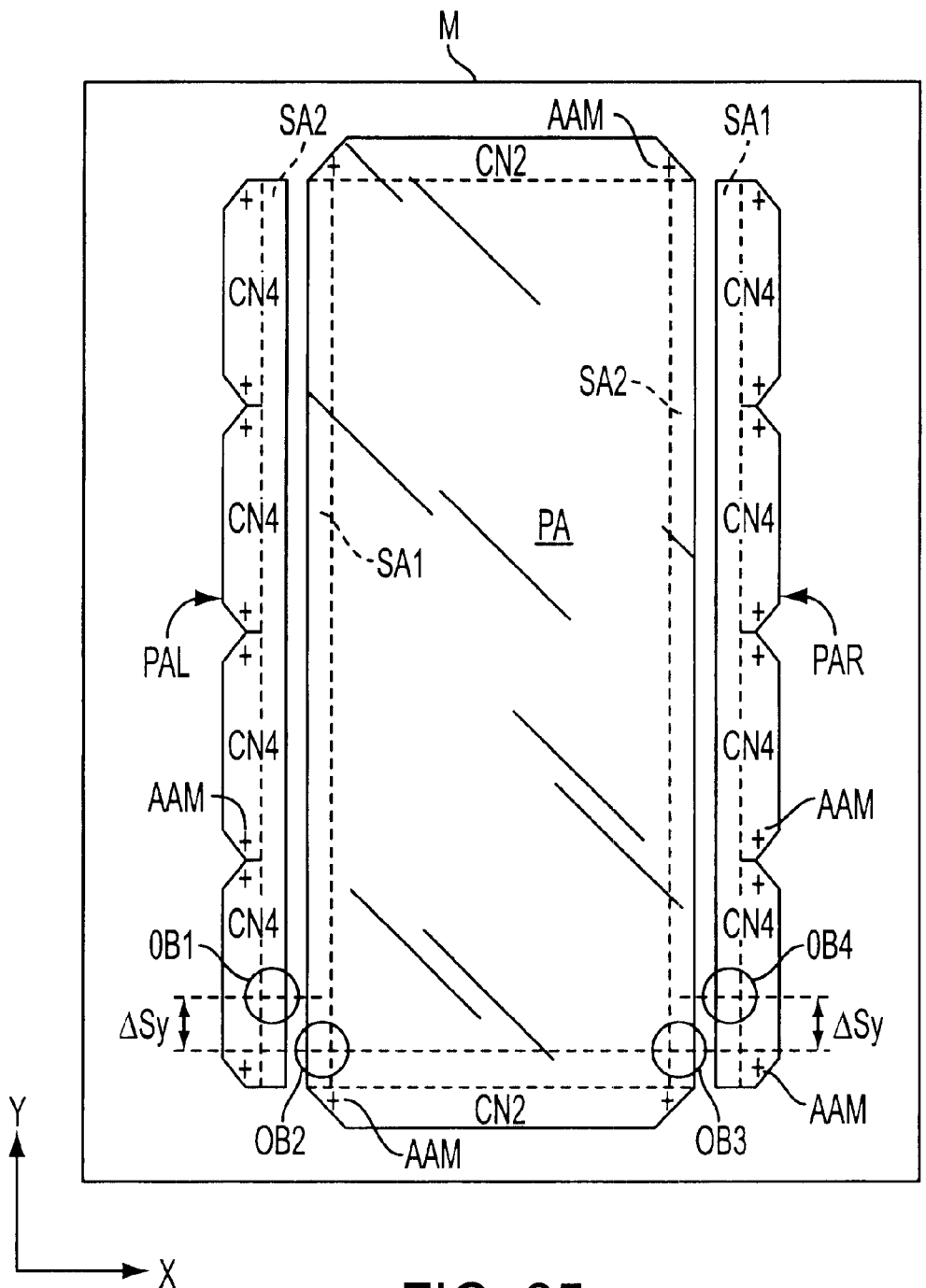
FIG. 25 is a diagram illustrating a testing mechanism in order to inspect a pattern formed on the mask shown in FIG. 23.

FIG. 25 shows a mask M that is the same as in FIG. 23. Using the device shown in FIG. 26, the respective patterns in the stitch regions SA1, SA2, are enlarged via the respective objective lenses OB1, OB2, OB3, OB4 of the detection device. Each enlarged image is photoelectrically converted in the photo imaging elements of a CCD and the like, with the binary images being formed of a predetermined region present on the mask M (for example, 0.3–1 mm square). Among these binary images, within the regions SA1, SA2 to be stitched together the image counterpart obtained in the same stitch portion is digitally stitched together using a computer, and the stitched-together binary images are compared with the design pattern information (CAD information and the like) to determine if there are large stitch errors in the stitched-together binary images (for example, if there is a breaking off of division pattern elements, position displacement errors, and the like).

In FIG. 25, the optical axis position of the objective lens OB1, which scans the stitch region SA2 of the left terminal pattern region PAL, and the optical axis position of the objective lens OB2 which scans the stitch region SA2 of the collective pattern region PA, deviate in the Y direction by $\Delta$sy. The deviation is due to the X direction width of the light barrier element between the terminal portion pattern region PAL and the collective pattern region PA being small in comparison with the lens barrel diameter of the objective lenses OB1 and OB2. Thus, the objective lens barrels are located to avoid interference.

As previously mentioned, because the width in the X direction of the stitch regions SA1, SA2 is about 5–30 mm, the device changes the enlargement of the respective objective lens OB1–OB4 according to the precision of inspection. The image photographed by the CCD via the respective objective lens, when digitally combined using a computer, has a mechanism that compensates the previously found interval error of the optical axis position of the respective objective lens (so-called baseline control).

Figure 26:
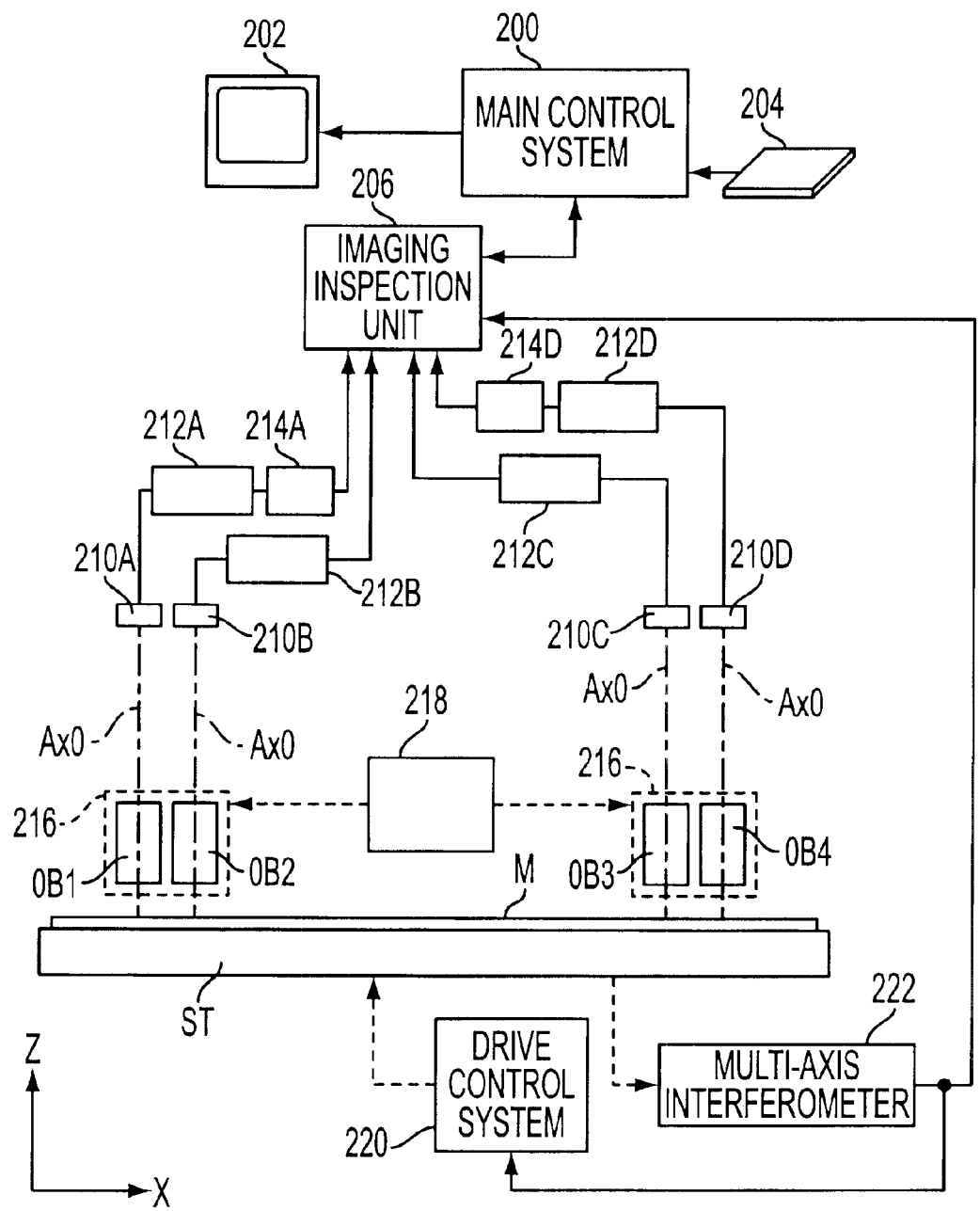
FIG. 26 schematically illustrates an inspection device in order to test images from the mask of FIG. 25.

FIG. 26 schematically shows the schematic constitution of a pattern inspection device performing the inspection method according to an embodiment of the present invention. The mask shown in FIG. 25 is attached with the pattern surface upward to a two-dimensionally movable stage ST. A drive control system 220 has a feed mechanism, either a linear motor, a ball-screw and rotary motor, or the like. The feed mechanism moves the movable stage ST in two dimensions in the XY plane. The movement coordinate position or fine rotation deviation or the like of the stage ST is sequentially measured by means of a multi-axis interferometer unit 222 projecting laser beams to right angle moving mirrors.

The objective lenses OB1–OB4 shown in FIG. 25 are positioned above the mask M to be inspected. An image of a local pattern on the mask M is enlarged by the respective objective lens and is detected by various image elements 210A, 210B, 210C, 210D of the CCD. Moreover, the relative gap between the optical axes AxO of the respective objective lenses OB1-OB4 can be adjusted using suitable drive units 218 for a left objective unit 216, containing objective lenses OB1, OB2, and a right objective unit 216 containing objective lenses OB3, OB4.

Furthermore, the drive unit 218 adjusts the gap between the optical axes AxO of the respective objective lenses according to the gap dimension between the stitch regions SA1 of the terminal unit pattern and the collective pattern region PA, and the gap dimension of the stitch regions SA1 between the terminal unit pattern region PAL and collective pattern region PA. Based upon this information, the positional relationship of the detection visual fields of the objective lenses OB1, OB2 and/or the positional relationship of the detection visual fields of the objective lenses OB3, OB4 is adjusted.

These adjustments of distance between the optical axes, the respective units of the objective lenses OB1–OB4 according to the stitch regions SA1, SA2 to be detected, and the corresponding CCD image elements 210A–210D are performed when large positional changes have to be physically made in the XY directions. For smaller positional adjustments as compared to the size of the observation visual field, these positioned adjustments can be done by shifting the image mounting range using the CCD imaging elements, or inclining a parallel flat plate glass arranged in the light path of the objective lens.

The image signals output from the respective CCD imaging elements 210A–210D are changed into a digital image (black and white image) digitized at a predetermined stitch level by respective corresponding digitizing circuits 212A, 212B, 212C, 212D. Of these, the digital image information from the digitizing circuits 212A, 212D is sent to image inspection unit 206. Image inspection unit 206 has a computer that receives, via inversion, circuits 214A, 214D. The digital image information respectively from the digitizing circuits 212b, 212C is sent unchanged to the image inspection unit 206.

The image inspection unit 206 automatically decides whether or not the respective patterns within the stitch regions SA1, SA2 are in the correct arrangement to be joined on a plate based on this image information, the information output from the multi-axis interferometer 222 regarding the position coordinates or fine rotational deviation of the stage ST, the distance ($\Delta$Sy) between the respective optical axes AxO of the objective lenses, and the like.

During this process, the stage ST moves continuously at a constant speed in the Y direction. When this movement falls within the range of imaging of the CCD imaging elements, the imaging inspection unit 206 sequentially stores the digital image information from the CCD imaging elements 210A–210D, and performs the inspection based on the stored digital image information. The stored information is time shifted according to the distance between the respective optical axes AxO of the objective lenses.

In this manner, the detected results are sent to the main control system 200, which has a main computer, and the results are displayed by a display device (terminal display) 202 in a manner easily understood by the operator. This main control system 200 generally controls the operation of the whole inspection device, the inspection mode of the image inspection unit 206, the operation of the drive control system 220 of the stage ST and/or the drive unit 218 of the objective unit 216 according to the parameter group (this one $\Delta$Sy in FIG. 25) which includes the various inspection conditions, the instructions from the operator input through a keyboard 204 or other like input device, the pattern location information on the mask, the mask pattern drawing error, or various adjustment offsets.

Figure 27:
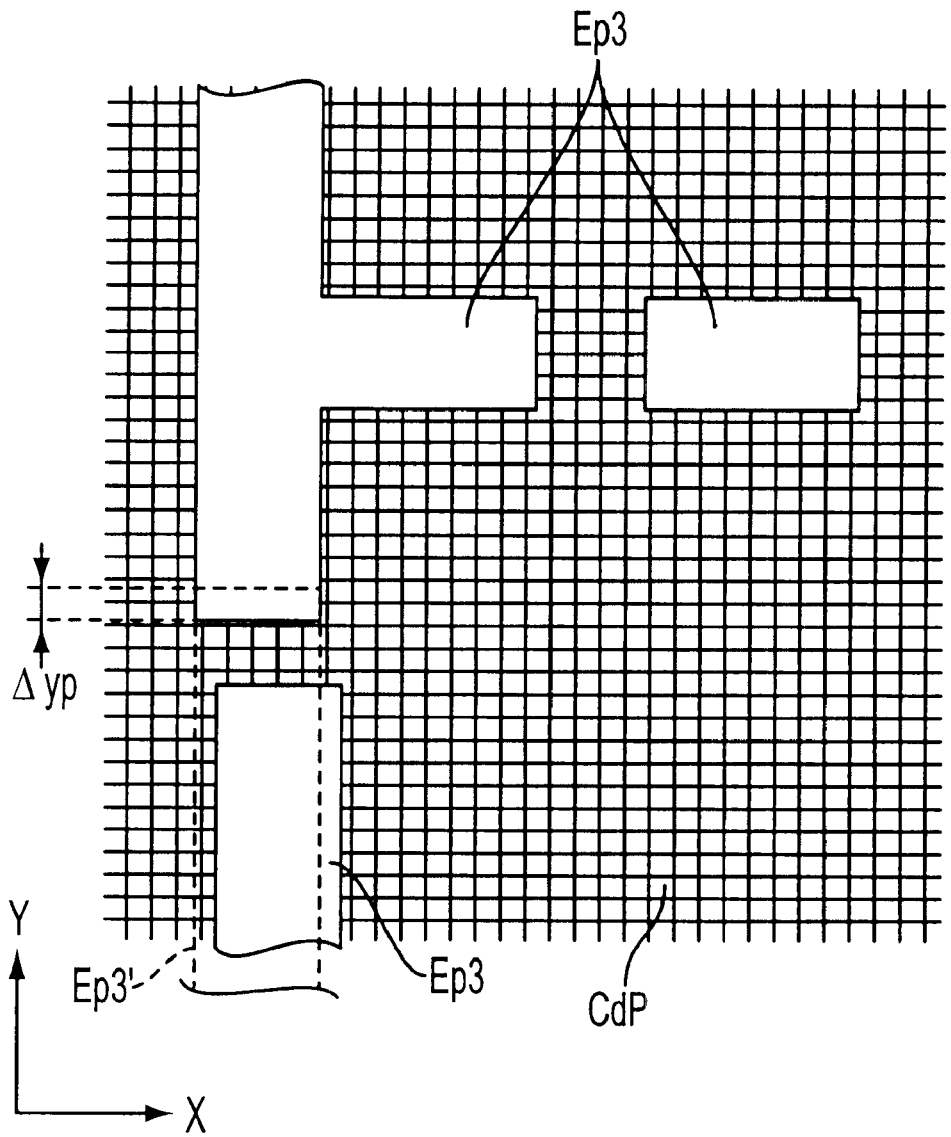
FIG. 27 is a diagram illustrating the binary pattern being tested for stitch accuracy by the inspection device of FIG. 26.

FIG. 27 shows an example of digital image processing for inspecting the quality of the connection state of the drain/gate wiring pattern formed in a stitch region. This drain/gate wiring pattern being is the division pattern element Ep3 shown in FIG. 11. The two-dimensional matrix represents one element CdP of a digital image imaged by the CCD imaging element. The respective element CdP is stored in digital memory by one-bit units of either "0" or "1".

In FIG. 27, the upper division pattern element Ep3, such as those formed within the stitch region SA1, and the lower division pattern element Ep3, such as those formed within the stitch region SA2, are temporarily represented as a two-dimensional digital image of logical "0"s or "1"s in the memory of the image inspection unit 206 in FIG. 26. The division pattern element Ep3 of the drain/gate wiring pattern, essentially, is one which continues overlapping by $\Delta$yp in the Y direction and without being disconnected in the manner of the pattern Ep3' shown by the broken line. Based upon this, the device determines the presence of defects on the mask during manufacture.

Moreover, when inspecting the mask in the division pattern element Ep2 formed as described for FIG. 10, because the division pattern element Ep2 is arranged at an array pitch of cells within the display region, the defect inspection uses an algorithm that decides whether or not the division pattern element Ep2 within the combined digital image is arrayed at the fixed pitch on the design.

Other than the quality decision of the stitch portion as above, it is possible to utilize an algorithm that decides whether or not there is a difference portion by comparing the same pattern structure counterpart formed in differing positions on the mask in the device of FIG. 26. For example, because the stitch region SA2 of the pattern region PA imaged by the objective lens OB1, and the stitch region SA2 of the pattern region PA imaged by the objective lens OB3, are essentially all designed as the same pattern structure (configuration, arrangement), there are no difference portions if there are no defects.

Therefore, for example, a comparison inspection is performed in a mode in which the logical "0" and "1" of the digital pattern information imaged by the objective lens OB1 and the binary circuit 212A, all inverted by means of the inversion circuit 214A as inverted binary image information, and the digital image information imaged by the objective lens OB3 and the binary circuit 212C, are sequentially calculated as the logical exclusive OR (EX-OR) of the positionally corresponding image CdP counterpart by the image inspection unit 206. Thus, if there are no defect (difference) portions within the image information which is to be compared, the logical value of all the elements CdP becomes "1", while in defect portions the logical value becomes "0".

In the inspection method shown in FIGS. 25–27, if the inspection device, while having the mask relative to the plural objective lenses, by acquiring digital images of the pattern within the stitch region to be inspected, the inspection time is shortened. In addition, it also allows diverse scan modes to be performed.

While certain embodiments of the present invention have been described hereinabove, various pattern regions PA, PAL, PAR and the like formed on the mask can be otherwise freely arranged, within a limited range governed by the dimension of the mask or the movement stroke and the like of the stage of the exposure device. These arrangements include but are not limited to forming the position of the collective pattern region PA or forming the position of the first terminal unit pattern regions PAL, PAR to be shifted a constant amount in the Y direction (scanning direction).

Moreover, an exposure device in order to carry out the exposure method of preferred embodiments of the present invention is not limited to the projection type of scanning exposure device, and may be a proximity type of exposure device in which the mask and plate (a photo-sensitive substrate) are caused to face each other at a constant gap. For this embodiment, a normal proximity exposure device is altered in order to stitch exposure and to dispose a stage mechanism or slider mechanism to cause relative movement of the mask and plate in the XY directions.

By the preferred embodiments of the present invention, even if the dimensions of the device to be formed on a plate are large, the size of the pattern region formed on the mask can be made compact. Further, if a pattern has a repeating portion, only a partial pattern representing the repeating periodic units is placed and formed on the mask, and by stitch exposure, a large type of display pattern can be simply formed on a plate.

Also, when manufacturing a large-type display device, if both sides of the peripheral regions are superimposed in the stitch direction of pattern regions formed on a mask, because the pattern structures (complementary interfitting relationship of array or arrangement) are disposed so as to make the joint inconspicuous, the effect is obtained that pattern regions on this mask can be repeatedly stitch exposed multiple times onto the plate.

Furthermore, according to the preferred embodiments of the present invention, by making the enveloping curve of the joint of stitch exposed mask patterns a straight line, triangular wave, or a polygonal line, or by gradating the division pattern elements arrayed in a stepping-stone random interfitting relationship within a constant width stitch portion, since stitch portions used in different layers exposed are superimposed, the effect of the contrast differences in the resulting joint on both sides of stitch portions on the display picture surface of a display device is greatly reduced to the naked eye.

In this manner with the structure of the mask patterns as in the preferred embodiments of the present invention, regardless of the kind of exposure device or exposure method, large display devices of 40 inches or more can be simply manufactured at a minimum of cycle times. In particular, when a scanning type of exposure device is used, in order to control the movement of the plate stage in the vertical scan line direction (the short side scanning direction) and in the horizontal scan line direction (the long side stepping direction) during scan exposure time, the respective movement strokes of the mask stage and plate stage are controlled to be small in order to continuously maintain simultaneous projection accuracy, and the size of the exposure device can be reduced.

Although a few preferred embodiments of the present invention have been shown and described, it would be appreciated by those skilled in the art that changes may be made in this embodiment without departing from the principles and spirit of the invention, the scope of which is defined in the claims and their equivalents.

What is claimed is:

1. A method of manufacture of a circuit device, comprising:
    transferring a plate while causing a relative positional relationship of a mask and the plate to change in a first direction so that a circuit pattern on the mask is transferred onto the plate, wherein the circuit pattern comprises a first peripheral pattern and a second peripheral pattern that is away from the first peripheral pattern along a second direction perpendicular to the first direction, the first peripheral pattern and the second peripheral pattern forming a complementary interfitting pattern with each other; and
    transferring the circuit pattern onto the plate so as to stitch the first peripheral pattern and the second peripheral pattern.

2. The method of claim 1, wherein the first peripheral pattern and the second peripheral pattern comprise a repetitively-formed fine pattern structure at predetermined intervals with respect to the first direction.

3. The method of claim 2, wherein the arrangement of the first peripheral pattern and the second peripheral pattern comprises a mutually complementary random interfitting relationship.

4. The method of claim 3, wherein the mutually complementary random interfitting relationship comprises minimum units, where the minimum units form the repetitively-formed fine pattern structure at predetermined intervals.

5. The method of claim 4, wherein the circuit device comprises a display portion of a display device, and the display portion of the display device is a standard display portion.

6. The method of claim 5, wherein the display portion comprises pixels, wherein each pixel has three pixel cell units corresponding to the three colors, red, green and blue for use in a color display, and wherein the fine pattern structure of the minimum unit was set in the pixel cell units.

7. The method of claim 5, wherein the display portion comprises pixels, where each pixel has three pixel cell units corresponding to the three colors, red, green and blue, for use in color display, wherein the minimum unit is determined in accordance with division pattern elements which are calculated according to a width of the stitched first peripheral pattern and the second peripheral pattern divided by the number of pixel cell units, and arraying the division pattern elements in random stepping-stone form with respect to the first direction.

8. The method of claim 7, wherein the width of the stitched first peripheral pattern and the second peripheral pattern relating to the first direction is determined according to a contrast difference between adjoining display regions formed by stitch exposure onto the plate.

9. The method of claim 1, wherein a first stitched portion of the first peripheral pattern and the second peripheral pattern for a first layer of the plate differs from a second stitched portion of the first peripheral pattern and the second peripheral pattern for a second layer of the plate.

10. A method of manufacturing a display device by exposing a pattern formed on a mask onto a plate using a projection system, the method comprising:
    transferring the pattern onto a first region of the plate by causing the mask and the plate to move in a first direction with respect to the projection system, the pattern having a first peripheral pattern and a second peripheral pattern that is away from the first peripheral pattern along a second direction perpendicular to the first direction;

causing the positional relationship of the mask and the plate to change in the second direction; and transferring the pattern onto a second region adjacent the first region in the second direction so as to stitch the first peripheral pattern and the second peripheral pattern so as to form a complementary interfitting pattern with each other, thereby forming a horizontal pattern along the second direction.

11. The method of claim 10, wherein the projection system comprises projection optical systems adjacently arranged in the second direction.

12. The method of claim 10, wherein the projection system transfers the pattern to the first region in the first and second directions using a circular field.

13. The method of claim 10, wherein a first stitched portion of the first peripheral pattern and the second peripheral pattern for a first layer of the plate differs from a second stitched portion of the first peripheral pattern and the second peripheral pattern for a second layer of the plate.

14. The method of claim 10, wherein a size of the display device is 30 inches or more in lateral length.

15. A method of transferring a pattern onto a substrate, comprising:

providing a mask having the pattern, the pattern having a first peripheral pattern and a second peripheral pattern that is away from the first peripheral pattern along a second direction perpendicular to a first direction, and the first peripheral pattern and the second peripheral pattern form a complementary interfitting pattern with each other; and transferring the pattern onto the substrate plural times so as to stitch the first peripheral pattern and the second peripheral pattern.

16. The method of claim 15, wherein a first stitched portion of the first peripheral pattern and the second peripheral pattern for a first layer of the substrate differs from a second stitched portion of the first peripheral pattern and the second peripheral pattern for a second layer of the substrate.

17. A scanning exposure device, comprising:

an illumination system to provide an illumination light;

a mask stage that holds a mask receiving the illumination light, the mask having a pattern that has a first peripheral pattern and a second peripheral pattern that is away from the first peripheral pattern along a second direction perpendicular to a first direction, the first peripheral pattern and the second peripheral pattern forming a complementary interfitting pattern with each other;

a plate stage that holds a plate having plural exposure areas;

a projection optical system that projects the pattern of the mask onto a respective exposure area of the plate; and a control system that moves said mask and plate stage plural times to stitch the first peripheral pattern and the second peripheral pattern on the plate.

18. The scanning exposure device of claim 17, wherein the mask further comprises a terminal image having a terminal circuit pattern and terminal joining elements; and said control system moves said mask and/or plate stage to form a terminal end of the display picture surface by stitch exposing the terminal circuit pattern projected into a terminal exposure area with an adjacent circuit pattern such that respective terminal elements and first or second joining elements are combined in an interfitting relationship defining signal pathways between the terminal and adjacent circuit patterns.

19. The scanning exposure device of claim 18, further comprising a blind disposed in the optical path between said illumination system and said plate stage, wherein said control system adjusts said blind to selectively project the image of the terminal circuit pattern onto said plate.

* * * * *